United States Patent
Kim et al.

(10) Patent No.: US 9,942,461 B2
(45) Date of Patent: Apr. 10, 2018

(54) AUTO-FOCUS IMAGE SENSOR AND DIGITAL IMAGE PROCESSING DEVICE INCLUDING THE SAME

(71) Applicants: Bumsuk Kim, Hwaseong-si (KR); Jungchak Ahn, Yongin-si (KR)

(72) Inventors: Bumsuk Kim, Hwaseong-si (KR); Jungchak Ahn, Yongin-si (KR)

(73) Assignee: Samsung Electronics Co., Ltd., Gyeonggi (KR)

( * ) Notice: Subject to any disclaimer, the term of this patent is extended or adjusted under 35 U.S.C. 154(b) by 0 days.

(21) Appl. No.: 14/746,302

(22) Filed: Jun. 22, 2015

(65) Prior Publication Data
US 2015/0373255 A1    Dec. 24, 2015

(30) Foreign Application Priority Data
Jun. 23, 2014    (KR) ........................ 10-2014-0076509

(51) Int. Cl.
*H04N 5/232*    (2006.01)
*H04N 5/369*    (2011.01)
*H01L 27/146*    (2006.01)

(52) U.S. Cl.
CPC ..... *H04N 5/23212* (2013.01); *H01L 27/1463* (2013.01); *H01L 27/1464* (2013.01); *H01L 27/14607* (2013.01); *H01L 27/14612* (2013.01); *H01L 27/14621* (2013.01); *H01L 27/14623* (2013.01); *H01L 27/14627* (2013.01);
(Continued)

(58) Field of Classification Search
CPC ............. H04N 5/23212; H04N 5/3696; H04N 5/37457; H04N 5/378; H04N 5/2254; H01L 27/14607; H01L 27/14612; H01L 27/14603; H01L 27/14621; H01L 27/14623; H01L 27/14627; H01L 27/1463; H01L 27/1464; H01L 27/14685; H01L 27/14689; H01L 27/14645; H01L 27/14636; H01L 27/14614; H01L 27/14662; H01L 27/14643; H01L 27/14638; H01L 27/14641
USPC ...................................... 250/208.1
See application file for complete search history.

(56) References Cited

U.S. PATENT DOCUMENTS

| | | | | |
|---|---|---|---|---|
| 6,121,148 A | * | 9/2000 | Bashir | ............... H01L 21/76264 257/E21.564 |
| 6,829,008 B1 | | 12/2004 | Kondo et al. | |
| 7,485,939 B2 | | 2/2009 | Tanaka et al. | |

(Continued)

OTHER PUBLICATIONS

Minoglou K et al., "Backside illuminated thinned CMOS Image Sensors for Space Imaging", IEEE Sensors, 2008, p. 1429-1432.

*Primary Examiner* — Michael Osinski
(74) *Attorney, Agent, or Firm* — Harness, Dickey & Pierce P.L.C.

(57) ABSTRACT

The inventive concepts provide an auto-focus image sensor and a digital image processing device including the same. The auto-focus image sensor includes a substrate including at least one first pixel used for detecting a phase difference and at least one second pixel used for detecting an image, a deep device isolation portion disposed in the substrate to isolate the first pixel from the second pixel, and a light shielding pattern disposed on the substrate of at least the first pixel. The amount of light incident on the first pixel is smaller than the amount of light incident on the second pixel by the light shielding pattern.

20 Claims, 44 Drawing Sheets

(52) U.S. Cl.
CPC .. *H01L 27/14685* (2013.01); *H01L 27/14689* (2013.01); *H04N 5/3696* (2013.01)

(56) References Cited

U.S. PATENT DOCUMENTS

| | | | |
|---|---|---|---|
| 7,544,982 B2* | 6/2009 | Yu | H01L 27/14627 257/294 |
| 7,592,654 B2 | 9/2009 | Bahl et al. | |
| 7,838,956 B2 | 11/2010 | McCarten et al. | |
| 7,989,907 B2 | 8/2011 | Inoue | |
| 8,071,455 B2 | 12/2011 | Cole et al. | |
| 8,237,206 B2 | 8/2012 | Wu | |
| 8,299,475 B2 | 10/2012 | Gambino et al. | |
| 8,357,890 B2 | 1/2013 | Chen et al. | |
| 8,378,399 B2 | 2/2013 | Maeda | |
| 8,390,089 B2 | 3/2013 | Chen et al. | |
| 8,507,962 B2 | 8/2013 | Anderson et al. | |
| 8,513,762 B2 | 8/2013 | Qian et al. | |
| 8,610,229 B2 | 12/2013 | Hsu et al. | |
| 8,633,557 B2 | 1/2014 | Kim et al. | |
| 8,638,381 B2 | 1/2014 | Murata | |
| 8,664,578 B2 | 3/2014 | Hirigoyen et al. | |
| 8,673,669 B2 | 3/2014 | Wu | |
| 8,674,283 B2 | 3/2014 | Roy et al. | |
| 8,692,304 B2 | 4/2014 | Huang et al. | |
| 8,916,917 B2* | 12/2014 | Furuya | H01L 27/14603 257/213 |
| 9,484,376 B2* | 11/2016 | Wang | H01L 27/1463 |
| 2004/0151460 A1 | 8/2004 | Kitcher et al. | |
| 2006/0180885 A1 | 8/2006 | Rhodes | |
| 2006/0261386 A1 | 11/2006 | Tanaka et al. | |
| 2008/0079045 A1 | 4/2008 | Bahl et al. | |
| 2009/0243021 A1 | 10/2009 | Cole et al. | |
| 2010/0038688 A1 | 2/2010 | Wu | |
| 2010/0096677 A1 | 4/2010 | Inoue | |
| 2010/0148289 A1 | 6/2010 | McCarten et al. | |
| 2010/0214453 A1 | 8/2010 | Murata | |
| 2011/0108715 A1 | 5/2011 | Chen et al. | |
| 2012/0009720 A1 | 1/2012 | Shim et al. | |
| 2012/0012965 A1 | 1/2012 | Maeda | |
| 2012/0018620 A1 | 1/2012 | Qian et al. | |
| 2012/0025199 A1* | 2/2012 | Chen | H01L 27/1464 257/75 |
| 2012/0032241 A1 | 2/2012 | Huang et al. | |
| 2012/0080732 A1 | 4/2012 | Anderson et al. | |
| 2012/0140100 A1* | 6/2012 | Shibazaki | H01L 27/14621 348/281 |
| 2012/0153127 A1 | 6/2012 | Hirigoyen et al. | |
| 2012/0153128 A1 | 6/2012 | Roy et al. | |
| 2012/0161299 A1 | 6/2012 | Gambino et al. | |
| 2012/0217605 A1* | 8/2012 | Kunikiyo | H01L 27/14603 257/443 |
| 2012/0261781 A1 | 10/2012 | Hsu et al. | |
| 2012/0276679 A1 | 11/2012 | Wu | |
| 2013/0021508 A1* | 1/2013 | Uranishi | H01L 27/14818 348/294 |
| 2013/0221410 A1 | 8/2013 | Ahn | |
| 2013/0221465 A1 | 8/2013 | Kim et al. | |
| 2014/0054662 A1* | 2/2014 | Yanagita | H01L 27/14629 257/291 |
| 2014/0327798 A1* | 11/2014 | Takakusagi | H04N 9/045 348/273 |
| 2015/0002713 A1* | 1/2015 | Nomura | H04N 5/23212 348/302 |
| 2015/0155328 A1* | 6/2015 | Park | H01L 27/14645 250/208.1 |
| 2015/0195467 A1* | 7/2015 | Shim | H01L 27/14603 348/281 |
| 2015/0243694 A1* | 8/2015 | Ihara | H01L 27/14605 257/443 |
| 2015/0311238 A1* | 10/2015 | Kim | H01L 27/14609 257/432 |
| 2016/0013231 A1* | 1/2016 | Lee | H01L 27/1463 257/432 |
| 2016/0013233 A1* | 1/2016 | Noudo | H01L 27/14623 250/208.1 |
| 2016/0049430 A1* | 2/2016 | Nomura | H01L 27/14623 257/432 |
| 2016/0049439 A1* | 2/2016 | Yanagita | H01L 27/14623 257/432 |
| 2016/0064430 A1* | 3/2016 | Lee | H01L 27/1463 348/302 |
| 2016/0172399 A1* | 6/2016 | Nakata | H01L 27/14621 348/308 |
| 2016/0204142 A1* | 7/2016 | Um | H01L 27/1463 257/446 |
| 2016/0322412 A1* | 11/2016 | Yamamoto | H01L 27/14621 |
| 2017/0047363 A1* | 2/2017 | Choi | H01L 27/1463 |

\* cited by examiner

AUTO-FOCUS IMAGE SENSOR AND DIGITAL IMAGE PROCESSING DEVICE INCLUDING THE SAME

CROSS-REFERENCE TO RELATED APPLICATION

This U.S. non-provisional patent application claims priority under 35 U.S.C. § 119 to Korean Patent Application No. 10-2014-0076509, filed on Jun. 23, 2014, in the Korean Intellectual Property Office, the disclosure of which is hereby incorporated by reference in its entirety.

BACKGROUND

The inventive concepts relate to an auto-focus image sensor and a digital image processing device including the same.

In a digital image processing device such as a camera, it may be helpful to detect a focus control state of a photographing lens to automatically control a focus of the lens. To achieve this, a conventional digital image processing device includes an additional focus detecting device separate and/or different from an image sensor. In this case, costs of the focus detecting device and/or an additional optical lens may be increased and/or an entire size of the digital image processing device may be increased by the focus detecting device. To solve these problems, an auto-focus image sensor using a method of detecting a phase difference has been developed.

SUMMARY

Example embodiments of the inventive concepts may provide an auto-focus image sensor capable of realizing a clearer image.

Example embodiments of the inventive concepts may also provide a digital image processing device capable of realizing a clearer image.

In one aspect, an auto-focus image sensor may include: a substrate comprising at least one first pixel used for detecting a phase difference and at least one second pixel used for detecting an image; a deep device isolation portion disposed in the substrate to isolate the first pixel from the second pixel; and a light shielding pattern disposed on the substrate of at least the first pixel. The amount of light incident on the first pixel may be smaller than the amount of light incident on the second pixel by the light shielding pattern. The substrate may include: a first surface on which a gate electrode is disposed; and a second surface opposite to the first surface. The deep device isolation portion may be adjacent to at least the second surface.

In some example embodiments, light may be incident through the first surface, the light shielding pattern may be disposed on the first surface, and charge generated from the first pixel may be transmitted through the light shielding pattern. In this case, the auto-focus image sensor may further include: an interconnection disposed on the first surface in the second pixel. Charge generated from the second pixel may be transmitted through the interconnection, and the light shielding pattern and the interconnection may be disposed at the same height from the first surface. The light shielding pattern may have a width greater than that of the interconnection.

In some example embodiments, light may be incident through the second surface, and the light shielding pattern may be disposed on the second surface. The deep device isolation portion may have a mesh structure, and the light shielding pattern may have a mesh structure that overlaps with the deep device isolation portion when viewed from a plan view. In this case, an area of the light shielding pattern in the first pixel may be greater than that of the light shielding pattern in the second pixel. In this case, a ground voltage or a reference voltage may be applied to the light shielding pattern.

In some example embodiments, the deep device isolation portion may penetrate the substrate so as to be exposed at the first and second surfaces.

In some example embodiments, the deep device isolation portion may include: a filling insulation layer; and a poly-silicon pattern disposed within the filling insulation layer.

In some example embodiments, the deep device isolation portion may include: a filling insulating layer; and a fixed charge layer disposed between the filling insulation layer and the substrate.

In some example embodiments, the fixed charge layer and the filling insulation layer may extend onto the second surface, and the fixed charge layer may be in contact with the second surface.

In some example embodiments, the fixed charge layer may be formed of a metal oxide or metal fluoride that includes at least one selected from a group consisting of hafnium (Hf), zirconium (Zr), aluminum (Al), tantalum (Ta), titanium (Ti), yttrium (Y), and a lanthanoid.

In some example embodiments, the deep device isolation portion may further include: a gap-fill assistant layer spaced apart from the fixed charge layer with the filling insulation layer therebetween.

In some example embodiments, the deep device isolation portion may include: a fixed charge layer being in contact with a sidewall of the substrate and an air gap region exposing the fixed charge layer.

In some example embodiments, the deep device isolation portion may include: a poly-silicon pattern disposed in a first trench extending from the first surface toward the second surface; a first filling insulation layer being in contact with both sidewalls of the poly-silicon pattern in the first trench; a fixed charge layer disposed in a second trench extending from the second surface toward the first surface, the second trench overlapping with the first trench, the fixed charge layer being in contact with both the first filling insulation layer and the poly-silicon pattern, and the fixed charge layer covering an inner sidewall of the second trench; and a second filling insulation layer filling the second trench.

In some example embodiments, the deep device isolation portion may include: a first deep device isolation portion adjacent to the first surface; and a second deep device isolation portion adjacent to the second surface. The second deep device isolation portion may be in contact with the first deep device isolation portion.

In some example embodiments, the auto-focus image sensor may further include: a fixed charge layer disposed on the second surface.

In some example embodiments, the auto-focus image sensor may further include: a shallow device isolation portion disposed in the substrate to define an active region, the shallow device isolation portion adjacent to the first surface; and a color filter and a micro-lens disposed on the first surface or the second surface.

In some example embodiments, a color filter disposed on the first pixel may not include a pigment.

In some example embodiments, the auto-focus image sensor may further include: a first ground region disposed in the substrate of the first pixel, the first ground region adjacent to the first surface in the first pixel, and a ground voltage applied to the substrate of the first pixel through the first ground region; and a second ground region disposed in the substrate of the second pixel, the second ground region adjacent to the first surface in the second pixel, and the ground voltage applied to the substrate of the second pixel through the second ground region.

In another aspect, a digital image processing device may include: the auto-focus image sensor; an optical system inputting light into the auto-focus image sensor; and a focus controller controlling a focus of the optical system using the phase difference detected from the first pixel.

In still another aspect, an auto-focus image sensor may include: a substrate comprising: a first auto-focus (AF) pixel and a second AF pixel that are used for detecting a phase difference and are adjacent to each other; and at least one image pixel used for detecting an image; a deep device isolation portion isolating the first AF pixel, the second AF pixel, and the image pixel from each other; and a light shielding pattern disposed on at least the first and second AF pixels, the light shielding pattern having a first opening and a second opening that partially expose the first AF pixel and the second AF pixel, respectively. The first opening and the second opening may be disposed to be symmetric.

In still another aspect, an auto-focus image sensor may include: a substrate including at least one first pixel configured to detect a phase difference and at least one second pixel configured to detect an image; an isolation portion configured to isolate the at least one first pixel from at least one second pixel; and a light shield on the substrate and between the at least one first pixel and incident light.

In some example embodiments, the auto-focus image sensor may include an amount of light incident on the at least one first pixel which may be smaller than an amount of light incident on the at least one second pixel.

In some example embodiments, the deep device isolation portion of the auto-focus image sensor may include a mesh structure and surrounds the at least one first pixel and the at least one second pixel in at least two directions.

In some example embodiments, the substrate of the auto-focus image sensor may include a first surface on which a gate electrode is disposed and a second surface opposite to the first surface and wherein the deep device isolation portion is adjacent to at least the second surface, the auto-focus image sensor further comprising: a shallow device isolation portion in the substrate to define an active region, the shallow device isolation portion adjacent to the first surface; and a color filter and a micro-lens on the first surface or the second surface.

In some example embodiments, a digital image processing device may comprise an auto-focus image sensor, an optical system configured to input light into the auto-focus image sensor; and a focus controller configured to control a focus of the optical system using the phase difference detected from the at least one first pixel.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings:

FIGS. 9A to 13A are plan views illustrating a method of fabricating an auto-focus image sensor having the upper layout of FIG. 6;

FIGS. 9B to 15B are cross-sectional views illustrating a method of fabricating an auto-focus image sensor having the cross-sectional view of FIG. 8;

DETAILED DESCRIPTION OF EXAMPLE EMBODIMENTS

Figure 1:
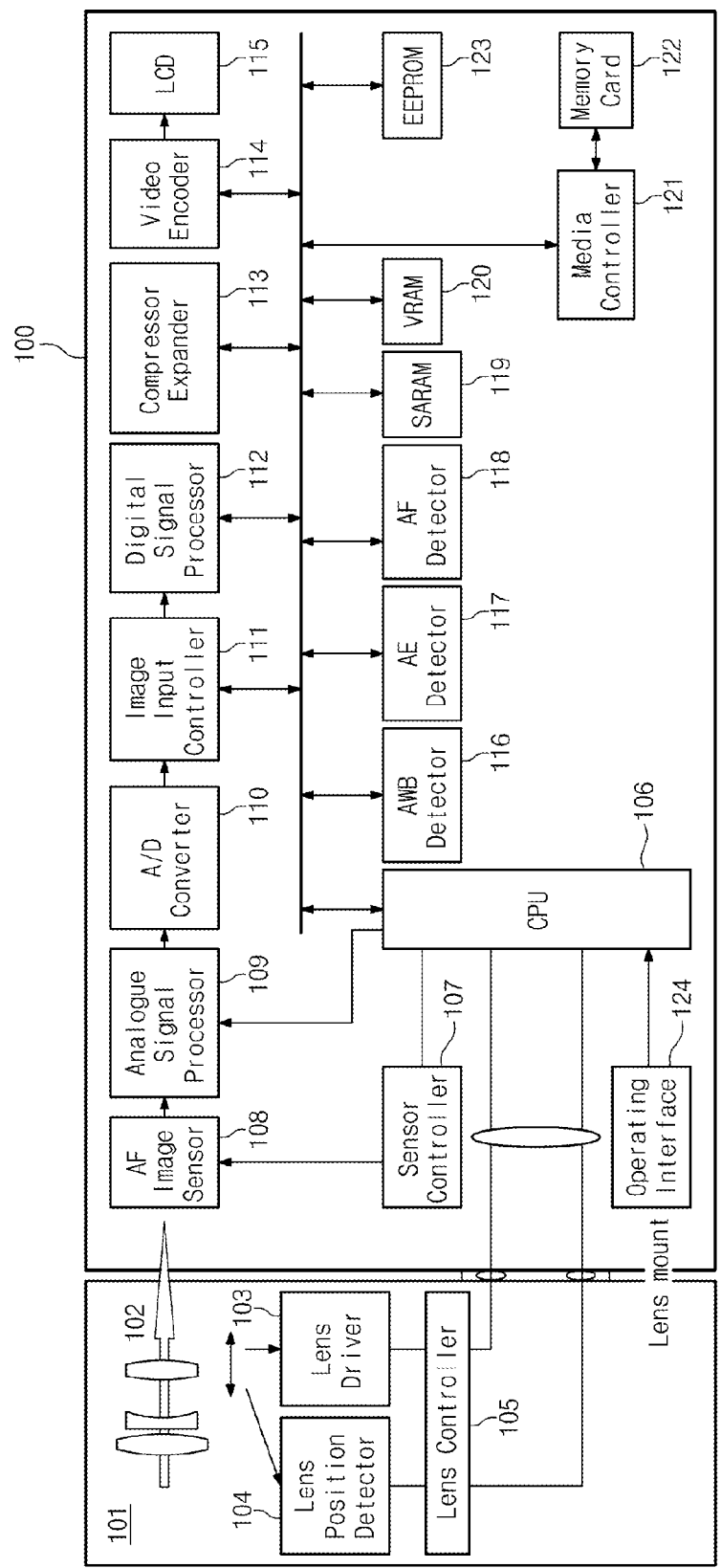
FIG. 1 is a schematic block diagram illustrating a digital image processing device according to some example embodiments of the inventive concepts.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal example views of the inventive concepts. Accordingly, shapes of the example views may be modified according to manufacturing techniques and/or allowable errors. Therefore, the embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a schematic block diagram illustrating a digital image processing device according to some example embodiments of the inventive concepts.

Referring to FIG. 1, a digital image processing device 100 may be separable from a lens. However, the inventive concepts are not limited thereto. An auto-focus image sensor 108 according to some example embodiments and the lens may constitute one integrated body. In addition, since the auto-focus image sensor 108 according to the inventive concepts is used, the digital image processing device 100 can perform a phase difference auto-focus (AF) process and a contrast AF process.

The digital image processing device 100 includes a photographing lens 101 including a focus lens 102. The digital image processing device 100 may have a focus detecting function and may drive the focus lens 102. The photographing lens 101 further includes a lens driver 103 driving the focus lens 102, a lens position detector 104 detecting a position of the focus lens 102, and a lens controller 105 controlling the focus lens 102. The lens controller 105 exchanges data relative to focus detection with a central processing unit (CPU) 106 of the digital image processing device 100.

The digital image processing device 100 includes the auto-focus image sensor 108. Thus, the digital image processing device 100 may photograph subject light inputted through the photographing lens 101 to generate an image signal. The auto-focus image sensor 108 may include a plurality of photoelectric converters (not shown) arranged in a matrix form and transmission lines (not shown) through which charge moves from the photoelectric converters to output the image signal.

A sensor controller 107 generates a timing signal, so the auto-focus image sensor 108 is controlled to photograph an image. In addition, the sensor controller 107 sequentially outputs image signals if charge accumulation is completed in each scanning line.

The outputted signals pass through an analog signal processing part 109 and are then converted into digital signals in an analog/digital (A/D) converter 110. The digital signals are inputted into an image input controller 111 and are then processed.

An auto-white balance (AWB) operation, an auto-exposure (AE) operation, and an AF operation are performed to a digital image signal inputted to the image input controller 111 in an AWB detecting part 116, an AE detecting part 117, and an AF detecting part 118, respectively. In some example embodiments, the AF detecting part 118 outputs a detecting value with respect to a contrast value during the contrast AF process and outputs pixel information to the CPU 106 during the phase difference AF process, so the CPU 106 performs a phase difference operation. The phase difference operation of the CPU 106 may be obtained by performing a correlation operation of a plurality of pixel column signals. A position or a direction of a focus may be obtained by the result of the phase difference operation.

An image signal is stored in a synchronous dynamic random access memory (SDRAM) 119 that is a temporary memory. A digital signal processor 112 performs one or more image signal processes (e.g., gamma correction) to create a displayable live view or a capture image. A compressor-expander 113 may compress the image signal in a compressed form (e.g., JPEG or H.264) or may expand the image signal when it is reproduced. An image file including the image signal compressed in the compressor-expander 113 is transmitted through a media controller 121 to be stored in a memory card 122.

In example embodiments, a nonvolatile memory may be embodied to include a three dimensional (3D) memory array. The 3D memory array may be monolithically formed on a substrate (e.g., semiconductor substrate such as silicon, or semiconductor-on-insulator substrate). The 3D memory array may include two or more physical levels of memory cells having an active area disposed above the substrate and circuitry associated with the operation of those memory cells, whether such associated circuitry is above or within such substrate. The layers of each level of the array may be directly deposited on the layers of each underlying level of the array.

In example embodiments, the 3D memory array may include vertical NAND strings that are vertically oriented such that at least one memory cell is located over another memory cell. The at least one memory cell may comprise a charge trap layer.

The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Display image information is stored in a video random access memory (VRAM) 120, and the image is disposed on a liquid crystal display (LCD) 115 through a video encoder 114. The CPU 106 used as a controller may control operations of each part. An electrically erasable programmable read-only memory (EEPROM) 123 may store and maintain information for correcting pixel defects of the auto-focus image sensor 108 or adjustment information. An operating interface 124 receives various commands from a user to operate the digital image processing device 100. The operating part 124 may include various buttons such as a shutter-release button (not shown), a main button (not shown), a mode dial (not shown), and/or a menu button (not shown).

When a structure is hardware, such existing hardware may include one or more Central Processing Units (CPUs), digital signal processors (DSPs), application-specific-integrated-circuits (ASICs), field programmable gate arrays (FPGAs) computers or the like configured as special purpose machines to perform the functions of the module. As stated above, CPUs, DSPs, ASICs and FPGAs may generally be referred to as processing devices.

In the event a structure is or includes a processor executing software, the processor is configured as a special purpose machine to execute the software, stored in a storage medium, to perform the functions of the structure.

Figure 2:
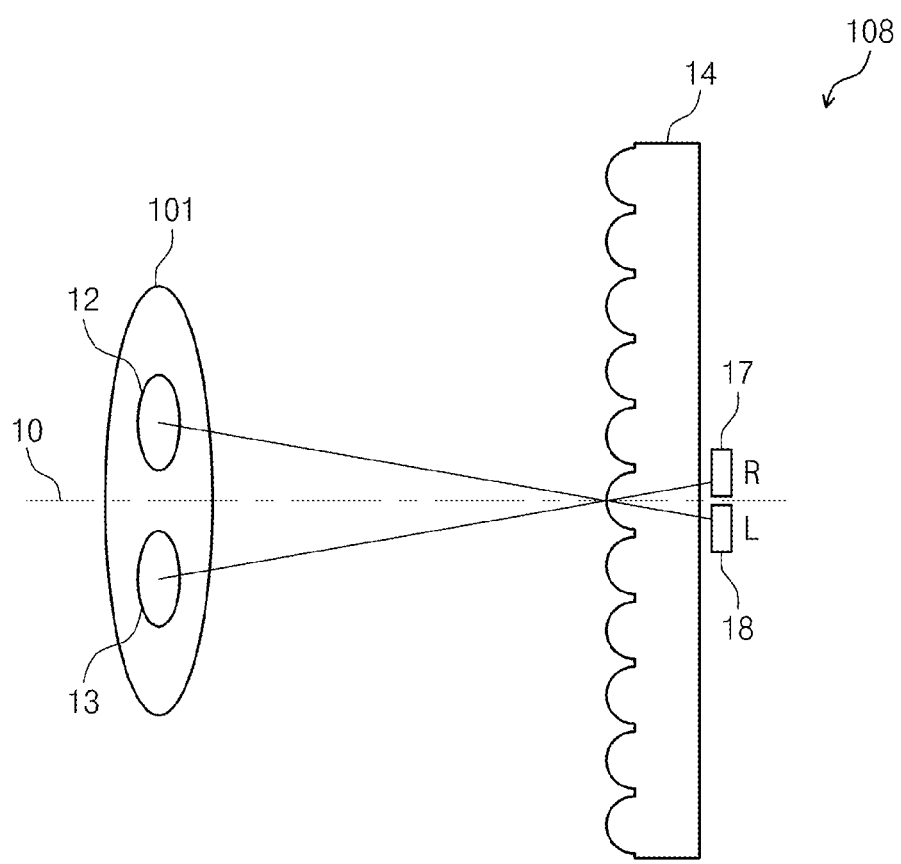
FIG. 2 is a diagram illustrating a principle of a phase-difference auto-focus (AF) using an auto-focus image sensor of FIG. 1.

FIG. 2 is a diagram illustrating a principle of a phase-difference auto-focus (AF) using an auto-focus image sensor of FIG. 1.

Referring to the phase difference AF principle diagram of FIG. 2, light (or incident light) of an object that has passed through the photographing lens 101 passes through a microlens array 14 so as to be introduced to a first AF pixel R and a second AF pixel L. Masks or openings 17 and 18 that limit light inputted from pupils 12 and 13 of the photographing lens 101 may be adjacent to portions of the first and second AF pixels R and L. The light inputted from the pupil 12 disposed above a light axis of the photographing lens 101 is induced to the second AF pixel L, and the light inputted from the pupil 13 disposed under the light axis of the photographing lens 101 is induced to the first AF pixel R. "Pupil segmentation" means that the first AF pixel R and the second AF pixel L receive light, which are reversely projected at positions of the pupils 12 and 13 by the micro-lens array 14, through the masks or openings 17 and 18.

Figure 3A:
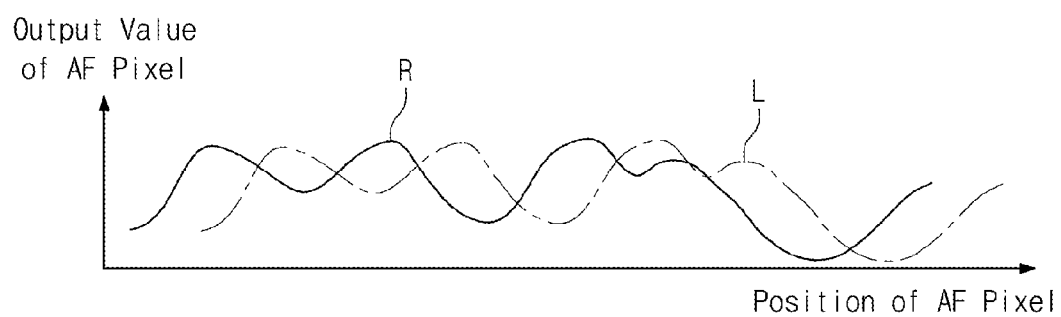
FIG. 3A is a graph illustrating phases of output values of auto-focus (AF) pixels when a photographing lens is out of focus.
Figure 3B:
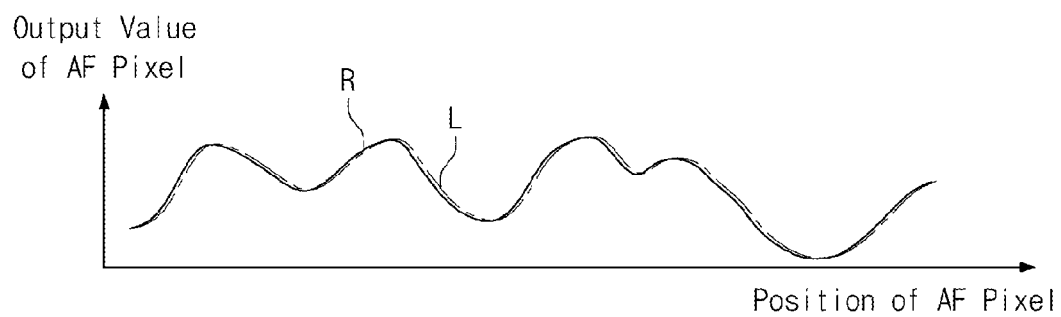
FIG. 3B is a graph illustrating phases of output values of auto-focus (AF) pixels when a photographing lens is in focus.

Continuous pupil-segmented pixel outputs of the first and second AF pixels R and L according to positions of the first and second AF pixels R and L are illustrated in FIGS. 3A and 3B. In each of FIGS. 3A and 3B, a horizontal axis represents a position of each of the first and second AF pixels R and L, and a vertical axis represents an output value of each of the first and second AF pixels R and L. A shape of the continuous output value of the first AF pixel R is the same as that of the second AF pixel L. However, positions (e.g., phases) of the output values of the first and second AF pixels R and L may be different from each other. This is because positions of image formation of the light provided from eccentric pupils 12 and 13 of the photographing lens 101 are different from each other. Thus, if the photographing lens 101 is out of focus, the phases of the output values of the first and second AF pixels are not co-located as illustrated in FIG. 3A. If the photographing lens 101 is in focus, the image is formed at the same position as illustrated in FIG. 3B. In addition, a direction of a focus difference may be determined from this. A front-focusing state means that the photographing lens 101 focuses in front of the object. In the front-focusing state, the phase of the output value of the first AF pixel R is left-shifted from a phase of a focused state and the phase of the output value of the second AF pixel L is right-shifted from the phase of the focused state. On the other hand, a back-focusing state means that the photographing lens 101 focuses on back of the object. In the back-focusing state, the phase of the output value of the first AF pixel R is right-shifted from the phase of the focused state and the phase of the output value of the second AF pixel L is left-shifted from the phase of the focused state. A shift amount between the phases of the output values of the first and second AF pixels R and L may be converted into a deviation amount between focuses.

Figure 4:
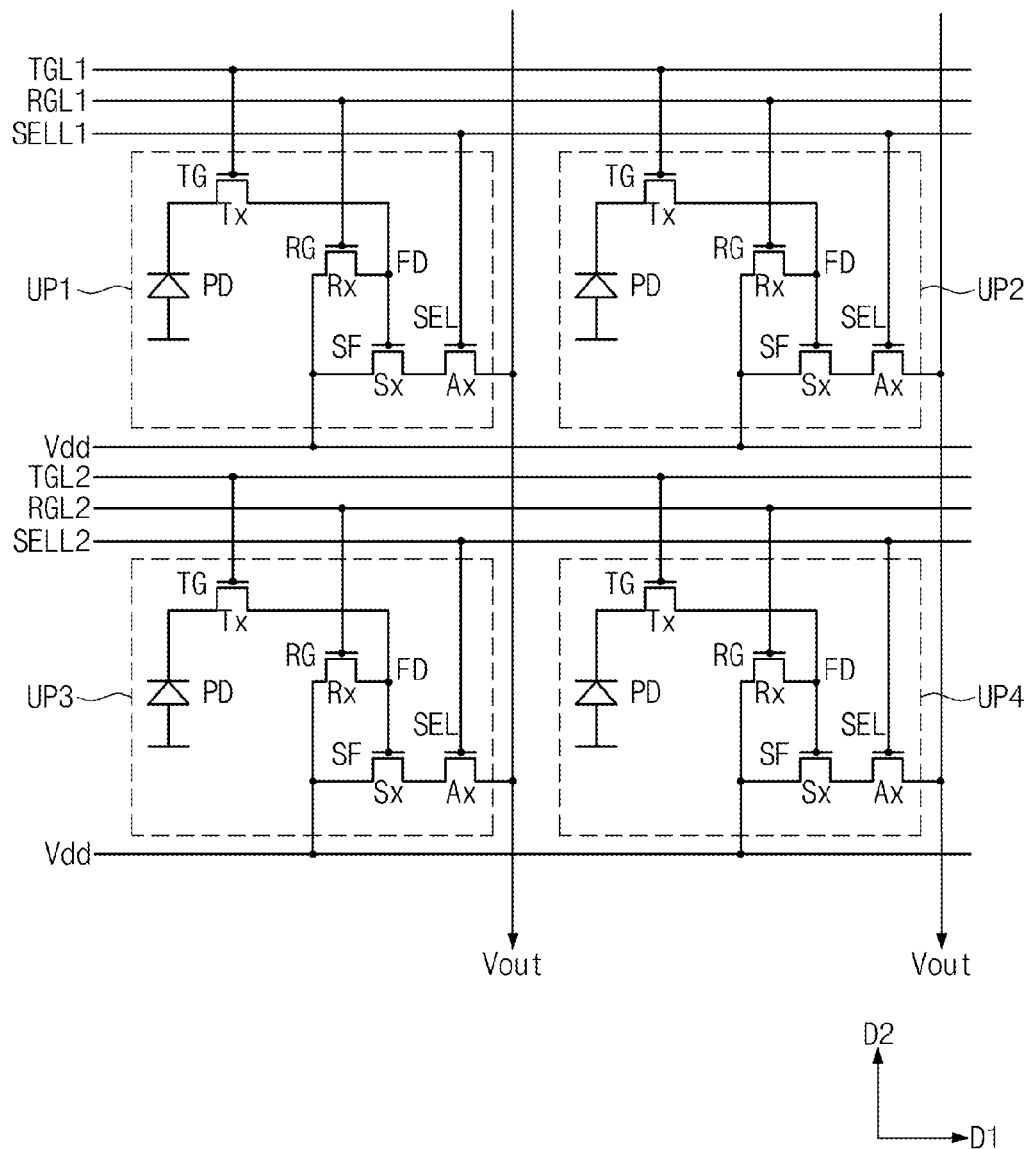
FIG. 4 is a circuit diagram of an auto-focus image sensor according to some example embodiments of the inventive concepts.

FIG. 4 is a circuit diagram of an auto-focus image sensor, for example, auto-focus image sensor 108, according to some example embodiments of the inventive concepts.

Referring to FIG. 4, each of unit pixels UP1, UP2, UP3, and UP4 of the auto-focus image sensor may include a photoelectric converter region PD, a transfer transistor Tx, a source follower transistor Sx, a reset transistor Rx, and a selection transistor Ax. In some example embodiments, four unit pixels adjacent to each other will be described as an example for the purpose of ease and convenience in explanation. However, the inventive concepts are not limited to the number of the unit pixels. The auto-focus image sensor 108 may include five or more unit pixels. At least two unit pixels adjacent to each other of the unit pixels UP1, UP2, UP3, and UP4 may be AF pixels that are used to detect a phase difference, and others of the unit pixels UP1, UP2, UP3, and UP4 may be image pixels that are used to detect an image.

The transfer transistor Tx, the source follower transistor Sx, the reset transistor Rx, and the selection transistor Ax may include a transfer gate TG, a source follower gate SF, a reset gate RG, and a selection gate SEL, respectively. A photoelectric converter is provided in the photoelectric converter region PD. The photoelectric PD may be a photodiode including an N-type dopant region and a P-type dopant region. A drain of the transfer transistor Tx may be a floating diffusion region FD. The floating diffusion region FD may also be a source of the reset transistor Rx. The floating diffusion region FD may be electrically connected to the source follower gate SF of the source follower transistor Sx. The source follower transistor Sx is connected to the selection transistor Ax.

The transfer gates TG of first and second unit pixels UP1 and UP2 adjacent to each other in a first direction D1 may be electrically connected to a first transfer gate line TGL1. The transfer gates TG of third and fourth unit pixels UP3 and UP4 adjacent to each other in the first direction D1 may be electrically connected to a second transfer gate line TGL2. Likewise, the reset gates RG of the first and second unit pixels UP1 and UP2 may be electrically connected to a first reset gate line RGL1, and the reset gates RG of the third and fourth unit pixels UP3 and UP4 may be electrically connected to a second reset gate line RGL2. The selection gates SEL of the first and second unit pixels UP1 and UP2 may be electrically connected to a first selection gate line SELL1, and the selection gates SEL of the third and fourth unit pixels UP3 and UP4 may be electrically connected to a second selection gate line SELL2.

The reset transistor Rx, the source follower transistor Sx, and the selection transistor Ax may be shared by neighboring pixels, thereby improving an integration degree of the auto-focus image sensor 108.

A method of operating the auto-focus image sensor will be described with reference to FIG. 1. For example, a power voltage Vdd is applied to the drains of the reset transistors Rx and the drains of the source follower transistors Sx of the first and second unit pixels UP1 and UP2 in a dark state, thereby discharging charge remaining in the floating diffusion regions FD. Thereafter, the reset transistors Rx are turned-off and light is inputted from an external system to the photoelectric converter regions PD to generate electron-hole pairs in the photoelectric converter regions PD. Holes are moved into and then accumulated in the P-type dopant regions, and electrons are moved into and then accumulated in the N-type dopant regions. If the transfer transistors Tx are turned-on, the electrons are transferred into and then accumulated in the floating diffusion regions FD. Gate biases of the source follower transistors Sx are changed in proportion to the amounts of the electrons accumulated in the floating diffusion regions FD, so source potentials of the source follower transistors Sx are changed. At this time, if the selection transistors Ax are turned-on, signals generated by the electrons are read through signal sensing lines Vout. Next, the processes described above may be performed on the third and fourth unit pixels UP3 and UP4.

If the first and second unit pixels UP1 and UP2 are the AF pixels and the third and fourth unit pixels UP3 and UP4 are the image pixels, output values like FIG. 3A are obtained from the AF pixels corresponding to the first and second unit pixels UP1 and UP2 and the photographing lens 101 of FIG. 1 then focuses using the obtained output values. Whether the photographing lens 101 focuses or not may be confirmed. In addition, whether output values like FIG. 3B are outputted from the AF pixels or not may be confirmed. If the digital image processing device 100 of FIG. 1 is a digital camera, a shutter may be pressed after the photographing lens 101 focuses, thereby obtaining an image from output values received from the image pixels such as the third and fourth unit pixels UP3 and UP4. As a result, a clean image may be obtained.

Figure 5A:
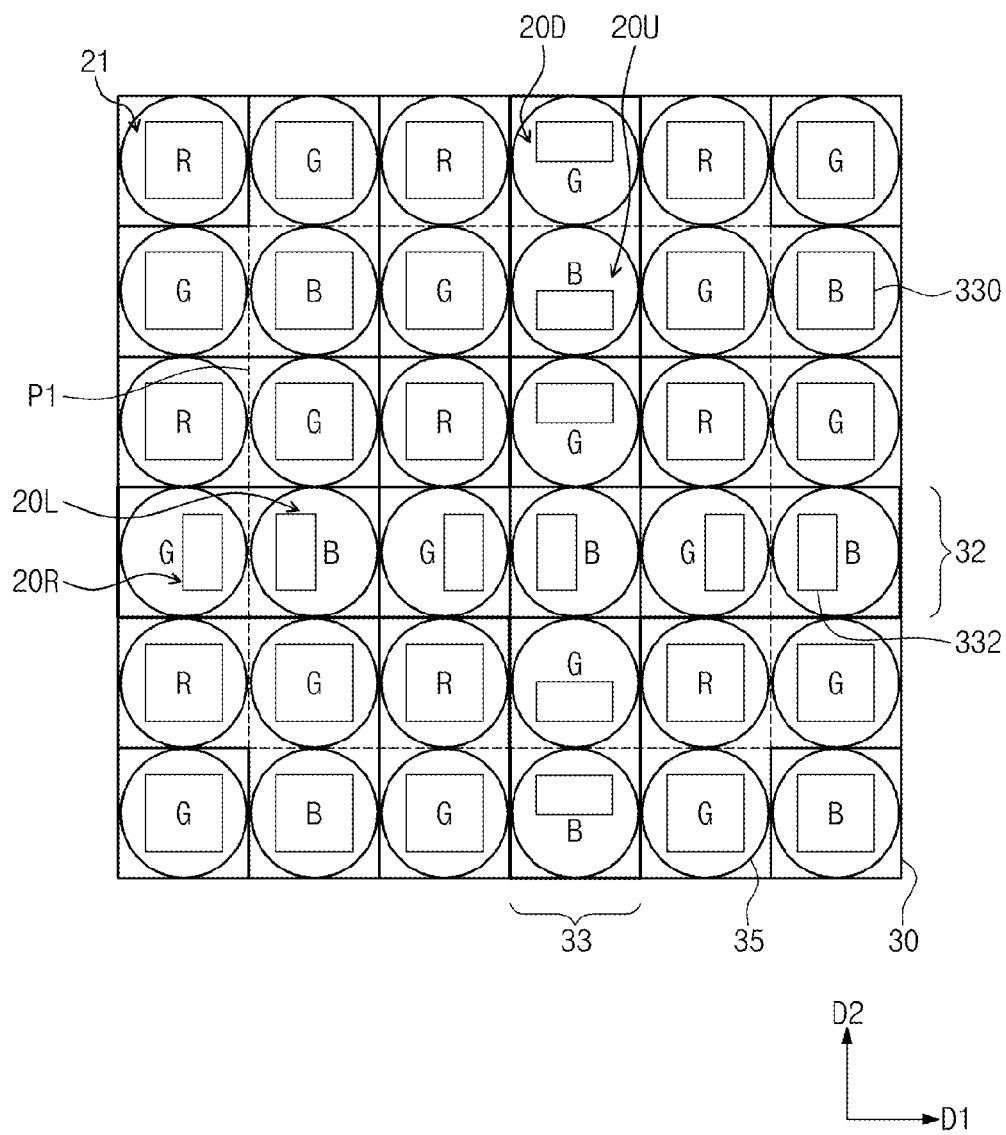
FIG. 5A is a layout illustrating a portion of a pixel region of an auto-focus image sensor according to some example embodiments of the inventive concepts.

FIG. 5A is a layout illustrating a portion of a pixel region of an auto-focus image sensor according to some example embodiments of the inventive concepts.

Referring to FIG. 5A, an auto-focus image sensor according to some example embodiments may include first and second focus detecting regions 32 and 33 and image detecting regions 30. The first focus detecting region 32 may extend in a first direction D1, and the second focus detecting region 33 may extend in a second direction D2 intersecting the first direction D1. The first focus detecting region 32 may include a first AF pixel 20R and a second AF pixel 20L that are adjacent to each other and are used to detect a phase difference. In some example embodiments, the first focus detecting region 32 may include a plurality of first AF pixels 20R and a plurality of second AF pixels 20L that are alternately arranged along the first direction D1. The second focus detecting region 33 may include a third AF pixel 20D and a fourth AF pixel 20U that are adjacent to each other and are used to detect a phase difference. In some example embodiments, the second focus detecting region 33 may include a plurality of third AF pixels 20D and a plurality of fourth AF pixels 20U that are alternately arranged along the second direction D2. The image detecting region 30 may include image pixels 21. In some example embodiments, the first and second focus detecting regions 32 and 33 may intercross to constitute a cross shape. FIG. 5 illustrates a portion of a pixel region, so a cross point of the first and second focus detecting regions 32 and 33 is illustrated to be one-sided. However, the cross point of the first and second focus detection regions 32 and 33 may be disposed at a center of an entire portion of the pixel region.

A color filter array may be disposed on the first and second focus detecting regions 32 and 33 and the image detecting regions 30. The color filter array may be a Bayer pattern array consisting of red (R), green (G), and blue (B) or may adopt a complementary color system (e.g., a system using magenta, green, cyan, and yellow). Color filters disposed on the AF pixels 20R, 20L, 20D, and 20U may not be used to realize colors. However, color filters may also be formed on the AF pixels 20R, 20L, 20D, and 20U for the purpose of convenience in a process of forming the color filter array. A micro-lens array 35 is disposed on the color filter array.

A light shielding pattern that controls light-receiving amounts of at least the AF pixels 20R, 20L, 20D, and 20U may be disposed under the color filter array. Thus, the light shielding pattern of the AF pixels 20R, 20L, 20D, and 20U may include one or more first openings 332. The light shielding pattern may further include second openings 330 disposed on the image pixels 21. An area of each of the first openings 332 may be smaller than that of each of the second openings 330. For example, the area of the first opening 332 may be about 50% of the area of the second opening 330. The first opening 332 may be disposed to be one-sided from a light axis along which light is inputted. The first openings 332 of the first and second AF pixels 20R and 20L adjacent to each other may be disposed to be symmetric. The first openings 332 of the third and fourth AF pixels 20D and 20U adjacent to each other may be disposed to be symmetric. The first opening 332 of the light shielding pattern may reduce the amount of light incident on each of the AF pixels 20R, 20L, 20D, and 20U in comparison with the amount of light incident on the image pixel 21. In other words, the amount of the light incident on each AF pixel 20R, 20L, 20D, or 20U may be smaller than the amount of the light incident on the image pixel 21 due to the light shielding pattern.

Figure 5B:
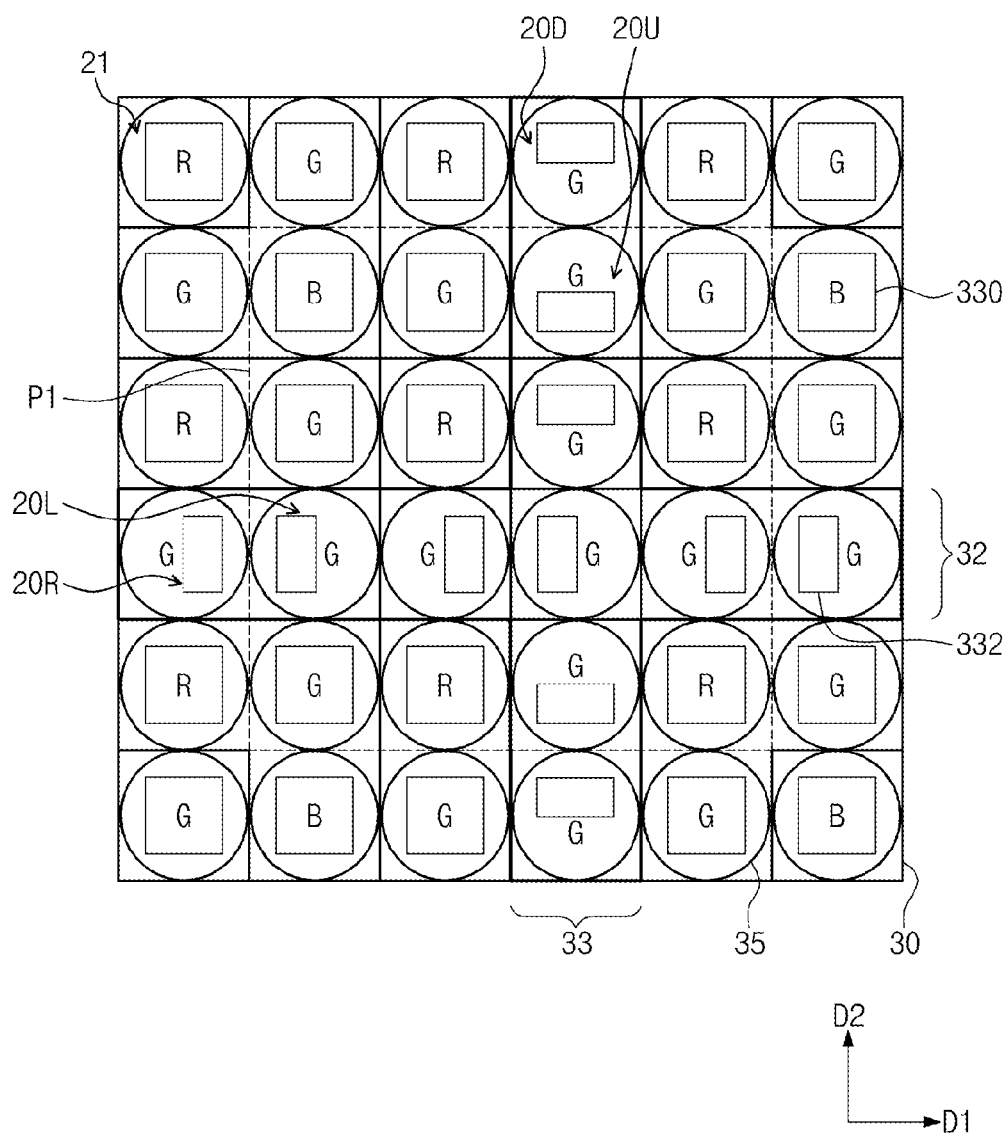
FIGS. 5B and 5C are layouts illustrating a portion of a pixel region of an auto-focus image sensor according to other example embodiments of the inventive concepts.
Figure 5C:
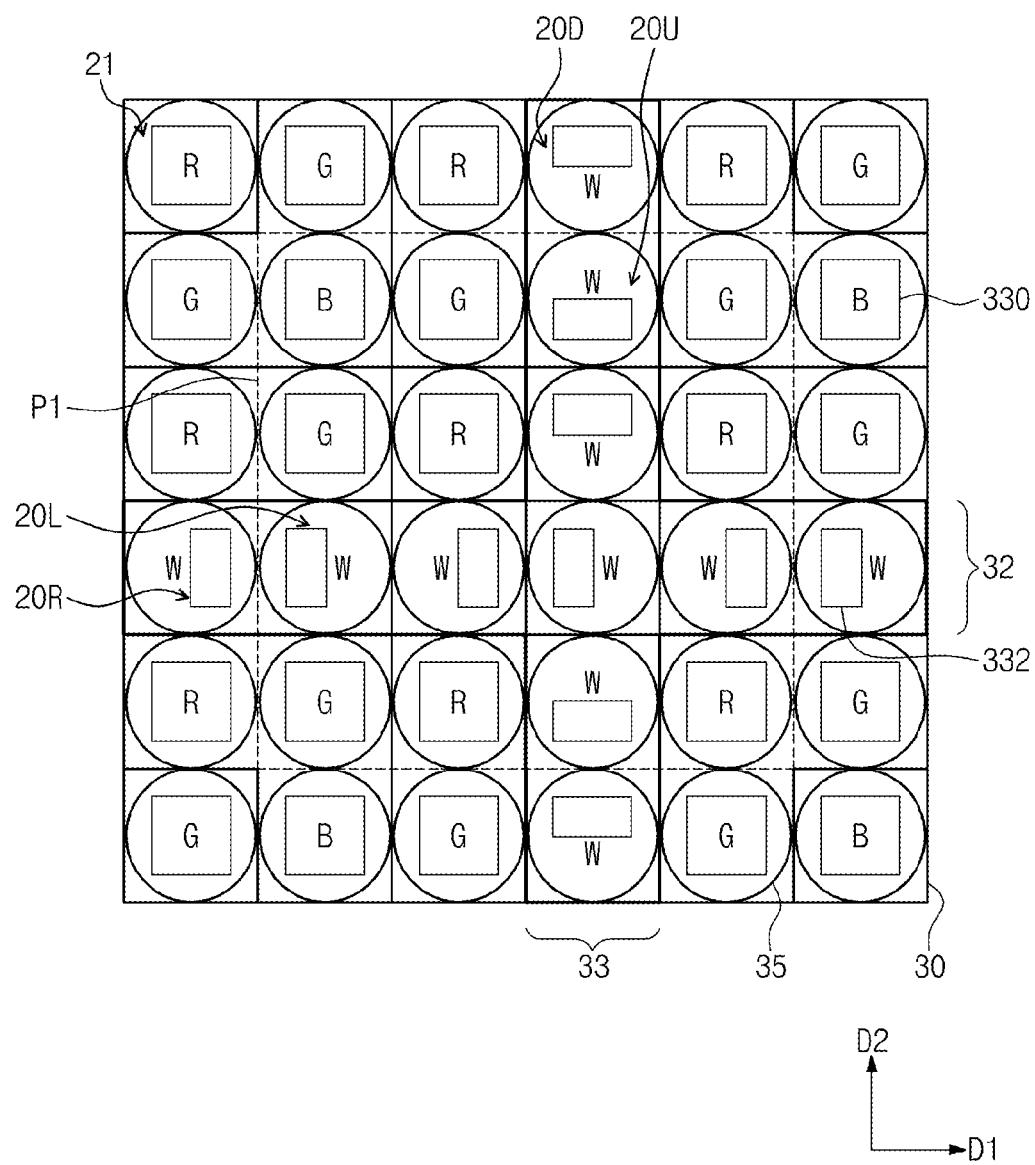

FIGS. 5B and 5C are layouts illustrating a portion of a pixel region of an auto-focus image sensor according to other example embodiments of the inventive concepts.

Referring to FIG. 5B, in an auto-focus image sensor according to some example embodiments, only green color filters G may be disposed on the first and second focus detecting regions 32 and 33.

Referring to FIG. 5C, in an auto-focus image sensor according to some example embodiments, color filters W disposed on the first and second focus detecting regions 32 and 33 may be white color filters or transparent filters. In other words, a pigment for showing a color such as red, green, and/or blue is not added to the color filters W. Thus, light of all wavelengths may be inputted into the AF pixels 20R, 20L, 20D, and 20U of the first and second focus detecting regions 32 and 33, so the light receiving amounts of the AF pixels 20R, 20L, 20D, and 20U may increase to improve photosensitivity of the AF pixels 20R, 20L, 20D, and 20U.

Alternatively, color filters may not exist on the AF pixels 20R, 20L, 20D, and 20U of the first and second focus detecting regions 32 and 33.

Figure 6:
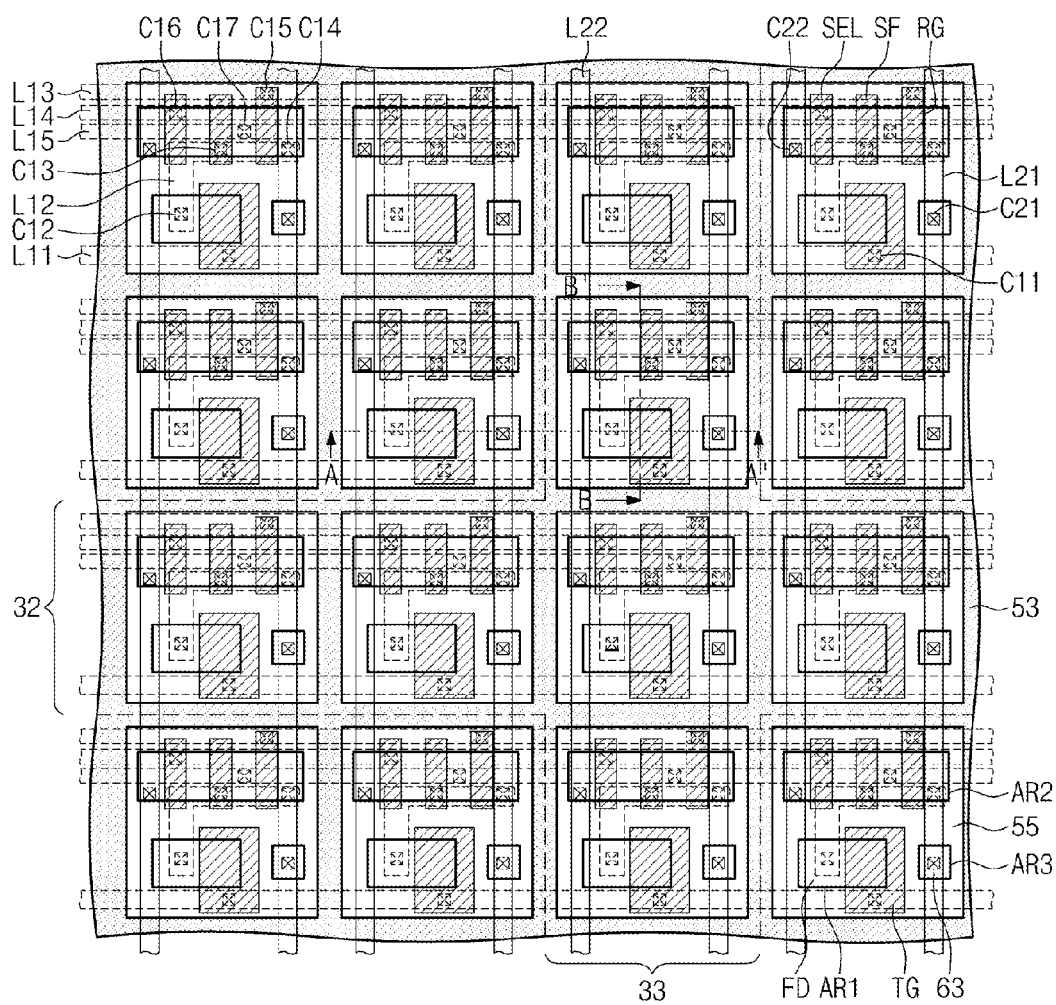
FIG. 6 is an upper layout of an auto-focus image sensor according to some example embodiments of the inventive concepts.
Figure 7:
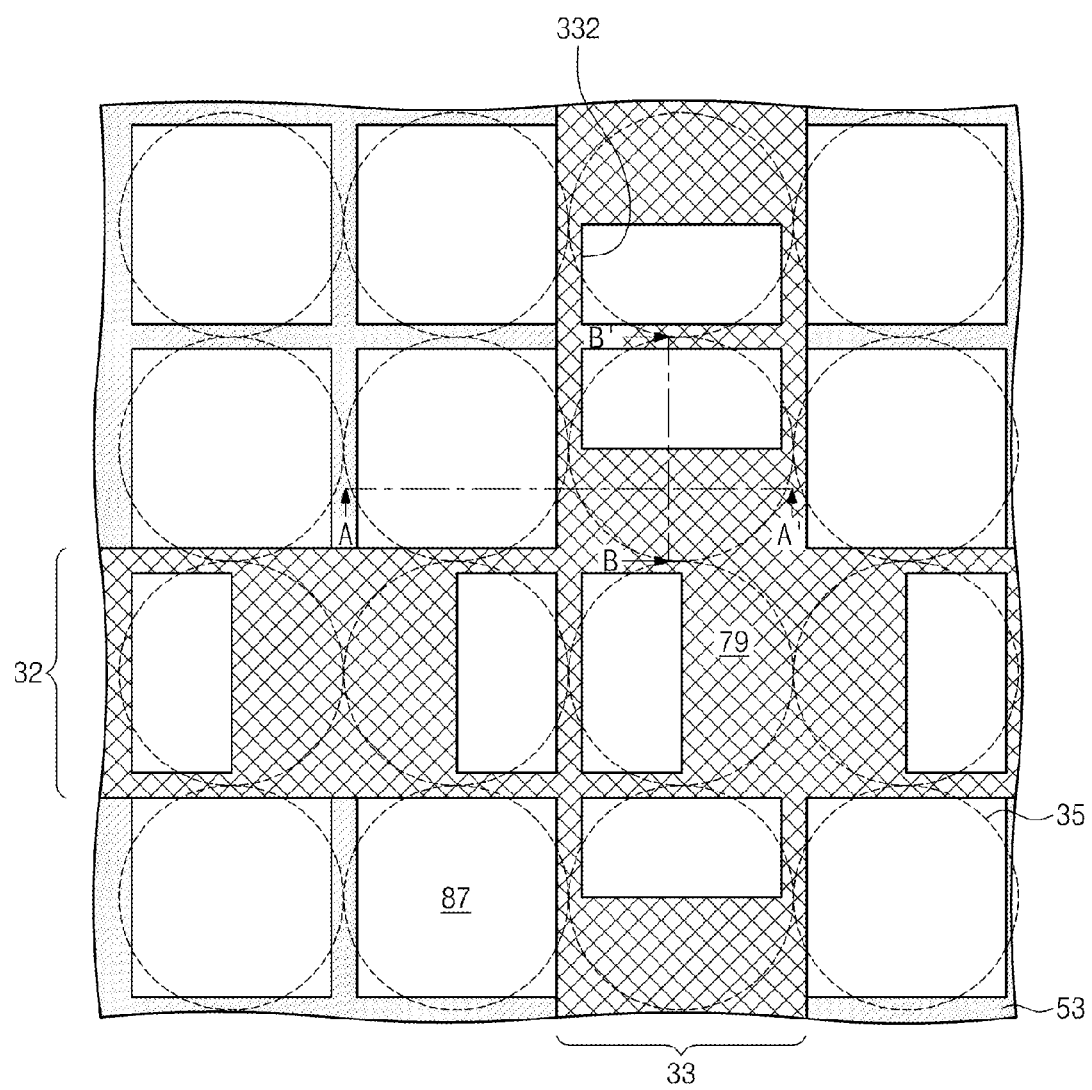
FIG. 7 is a lower layout of the auto-focus image sensor of FIG. 6.
Figure 8:
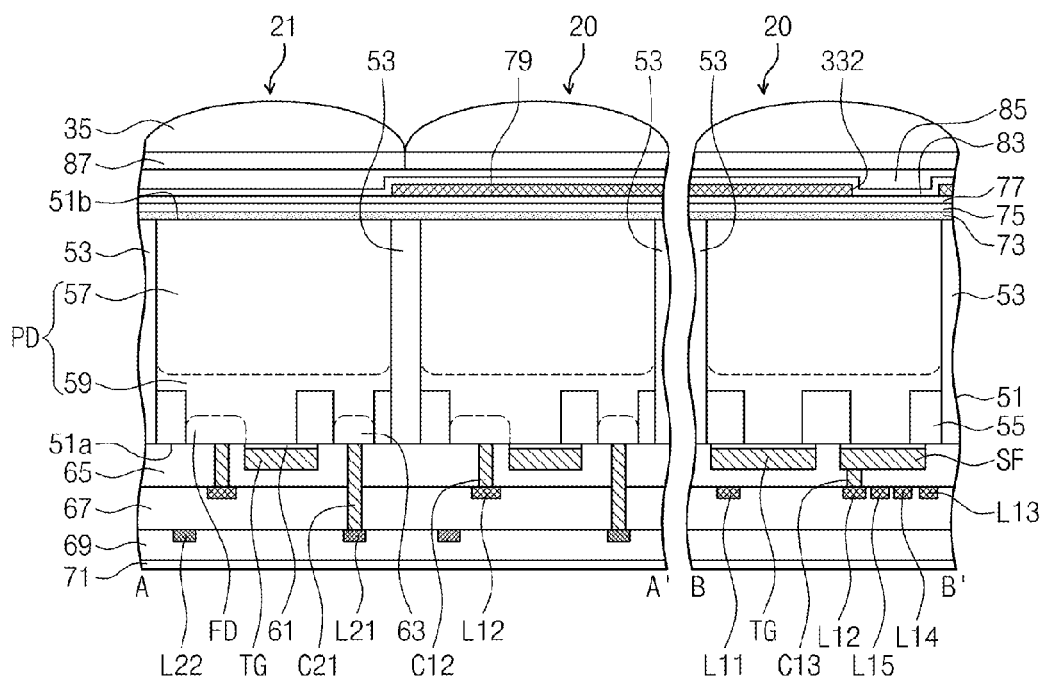
FIG. 8 is a cross-sectional view taken along lines A-A' and B-B' of FIG. 6 or 7.

FIG. 6 is an upper layout of an auto-focus image sensor according to some example embodiments of the inventive concepts. FIG. 7 is a lower layout of the auto-focus image sensor of FIG. 6. FIG. 8 is a cross-sectional view taken along lines A-A' and B-B' of FIG. 6 or 7. An auto-focus image sensor according to some example embodiments may be a backside-illuminated auto-focus image sensor.

Referring to FIGS. 6 to 8, the auto-focus image sensor according to some example embodiments includes a substrate 51 that has a first surface 51a and a second surface 51b opposite to each other. A deep device isolation layer (or a deep device isolation portion or isolation portion) 53 is disposed in the substrate 51 to separate AF pixels 20 and image pixels 21 from each other. As described with reference to FIGS. 5A to 5C, the AF pixels 20 may be disposed in first and second focus detecting regions 32 and 33 and the image pixels 21 may be disposed in image detecting regions 30. In some example embodiments, the deep device isolation layer 53 may penetrate the substrate 51 so as to be exposed at the first and second surfaces 51a and 51b. In each of the pixels 20 and 21, a shallow device isolation layer (or a shallow device isolation portion) 55 adjacent to the first surface 51a may be disposed to define first to third active regions AR1, AR2, and AR3 that are spaced apart from each other. The shallow device isolation layer 55 is spaced apart from the second surface 51b.

A photoelectric converter PD may be disposed in each of the pixels 20 and 21. The photoelectric converter PD may include a first dopant region 59 adjacent to the first surface 51a and a second dopant region 57 adjacent to the second surface 51b. For example, the first dopant region 59 may be doped with P-type dopants, and the second dopant region 57 may be doped with N-type dopants. A transfer gate TG may be disposed on the first surface 51a of the first active region AR1 with a gate insulating layer 61 therebetween. A reset gate RG, a source follower gate SF, and a selection gate SEL which are spaced apart from each other may be disposed on the first surface 51a of the second active region AR2. A floating diffusion region FD is disposed in the active region AR1. The floating diffusion region FD is adjacent to the first surface 51a which does not overlap with the transfer gate TG. The floating diffusion region FD is spaced apart from the second dopant region 57. A ground region 63 may be disposed in the third active region AR3 and may be adjacent to the first surface 51a. For example, the floating diffusion region FD may be doped with dopants of the same conductivity type as the dopants in the second dopant region 57. For example, the floating diffusion region FD may be doped with N-type dopants. The ground region 63 may be doped with dopants of the same conductivity type as the dopants in the first dopant region 59. For example, the ground region 63 may be doped with P-type dopants. Here, a dopant concentration of the ground region 63 may be higher than that of the first dopant region 59.

The first surface 51a of the substrate 51 is covered with a first interlayer insulating layer 65. First layer first to first layer seventh contacts C11 to C17 penetrate the first interlayer insulating layer 65. The first layer first contact C11 contacts the transfer gate TG. The first layer second contact C12 contacts the floating diffusion region FD. The first layer third contact C13 contacts the source follower gate SF. The first layer fourth contact C14 contacts a source region (of a reset transistor) disposed at a side of the reset gate RG. The first layer fifth contact C15 contacts the reset gate RG. The first layer sixth contact C16 contacts the selection gate SEL. The first layer seventh contact C17 contacts a dopant region between the reset gate RG and the source follower gate SF. The dopant region between the reset gate RG and the source follower gate SF corresponds to the drain of the reset transistor Rx and the drain of the source follower transistor Sx.

First layer first to first layer fifth signal lines L11 to L15 are disposed on the first interlayer insulating layer 65. The first signal lines L11 to L15 may correspond to interconnections. The first layer first signal line L11 contacts the first layer first contact C11, so a voltage may be applied to the transfer gate TG through the first layer first signal line L11. The first layer second signal line L12 contacts the first layer second to first layer fourth contacts C12 to C14 at the same time so as to electrically connect the floating diffusion region FD, the source region of the reset transistor, and the source follower gate SF to each other. The first layer third signal line L13 contacts the first layer fifth contact C15, so a voltage may be applied to the reset gate RG through the first layer third signal line L13. The first layer fourth signal line L14 contacts the first layer sixth contact C16, so a voltage may be applied to the selection gate SEL through the first layer fourth signal line L14. The first layer fifth signal line L15 contacts the first layer seventh contact C17, so the power voltage Vdd may be applied to the drains of the reset transistor and the source follower transistor through the first layer fifth signal line L15.

A second interlayer insulating layer 67 covers the first interlayer insulating layer 65 and the first layer first to first layer fifth signal lines L11 to L15. Second layer first and second layer second contacts C21 and C22 penetrate the second and first interlayer insulating layers 67 and 65. The second layer first contact C21 contacts the ground region 63. The second layer second contact C22 contacts a source (of the selection transistor) that is disposed at a side of the selection gate SEL.

A second layer first signal line L21 and a second layer second signal line L22 are disposed on the second interlayer insulating layer 67. The signal lines L21 and L22 may correspond to interconnections. The second layer first signal line L21 contacts the second layer first contact C21 so as to apply a ground voltage to the ground region 63. The second layer second signal line L22 contacts the second layer second contact C22. The second layer second signal line L22 may correspond to the signal sensing line Vout of FIG. 4.

A third interlayer insulating layer 69 may cover the second interlayer insulating layer 67 and the second layer first and second signal lines L21 and L22. The third interlayer insulating layer 69 may be covered with a first passivation layer 71.

A fixed charge layer 73 may be disposed on the second surface 51b of the substrate 51. The fixed charge layer 73 may be formed of a metal oxide or metal fluoride having oxygen or fluorine of which a content ratio is lower than its stoichiometric ratio. Thus, the fixed charge layer 73 may have negative fixed charge. The fixed charge layer 73 may be formed of a metal oxide or metal fluoride that includes at least one selected from a group consisting of hafnium (Hf), zirconium (Zr), aluminum (Al), tantalum (Ta), titanium (Ti), yttrium (Y), and a lanthanoid. For example, the fixed charge layer 73 may be a hafnium oxide layer or an aluminum fluoride layer. Holes may be accumulated around the second surface 51b due to the fixed charge layer 73, so occurrence of a dark current and white spots may be effectively reduced.

A first insulating layer 75 and a second insulating layer 77 may be sequentially stacked on the fixed charge layer 73. The first insulating layer 75 may be, for example, a silicon oxide layer. The second insulating layer 77 may be, for example, a silicon nitride layer.

A light shielding pattern (or light shield) 79 may be disposed on the second insulating layer 77. The light shielding pattern 79 may be formed of, for example, an opaque metal. The light shielding pattern 79 may be disposed in only the first and second focus detecting regions 32 and 33. As described with reference to FIGS. 5A to 5C, the first openings 332 may be disposed in the light shielding pattern 79.

A second passivation layer 83 may be conformally stacked on the light shielding pattern 79. A planarization layer 85 is disposed on the second passivation layer 83. A color filter array 87 may be disposed on the planarization layer 85, and a micro-lens array 35 may be disposed on the color filter array 87.

Since the auto-focus image sensor according to some example embodiments includes the deep device isolation layer 53, crosstalk between the pixels may be reduced or prevented.

If the auto-focus image sensor is a backside-illuminated type, light (or incident light) is inputted through the second surface 51b of the substrate 51. As a result, the signal lines L11 to L15, L21, and L22 adjacent to the first surface 51a may not be limited to their positions. For example, the signal lines L11 to L15, L21, and L22 may overlap with the photoelectric converter PD.

Next, a method of fabricating the auto-focus image sensor of FIGS. 6 to 8 will be described.

FIGS. 9A to 13A are plan views illustrating a method of fabricating an auto-focus image sensor having the upper layout of FIG. 6. FIGS. 14A and 15A are plan views illustrating a method of fabricating an auto-focus image sensor having the lower layout of FIG. 7. FIGS. 9B to 15B are cross-sectional views illustrating a method of fabricating an auto-focus image sensor having the cross-sectional view of FIG. 8.

Figure 9A:
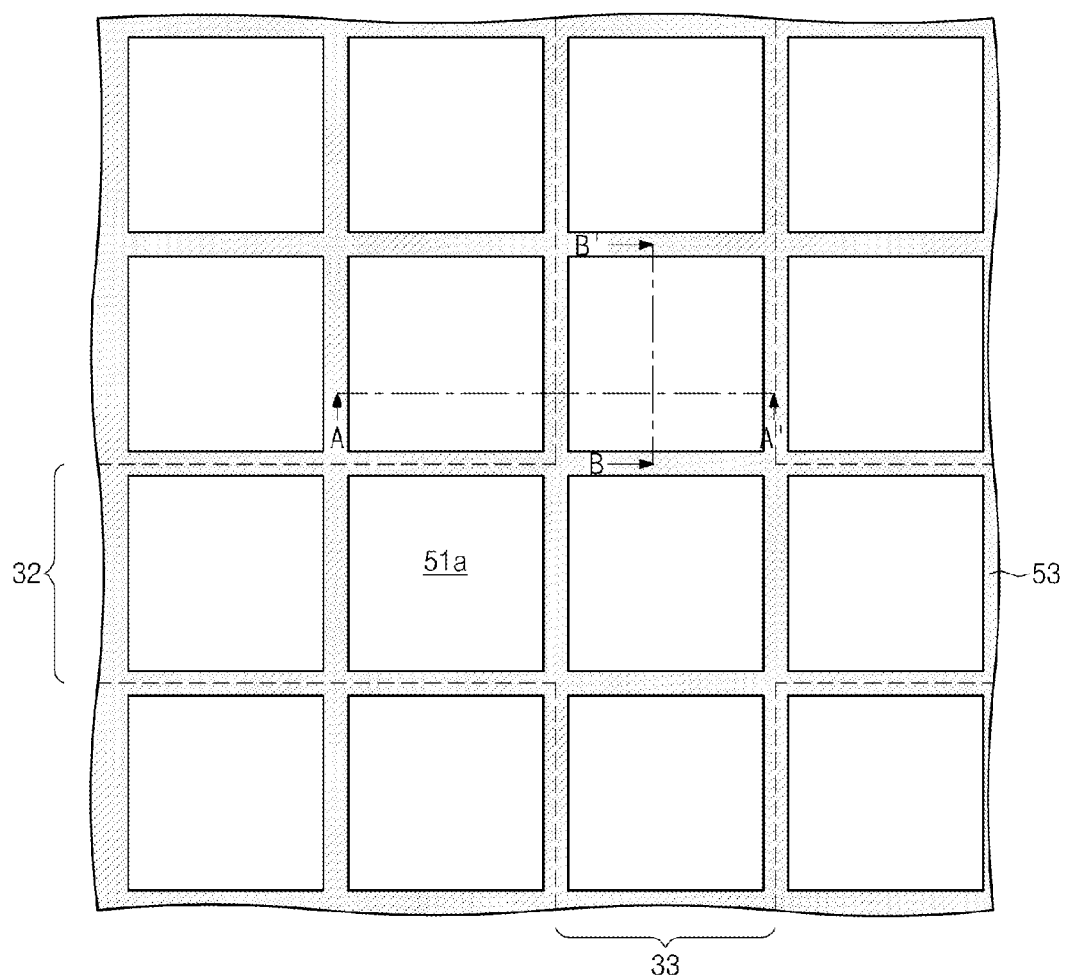
Figure 9B:
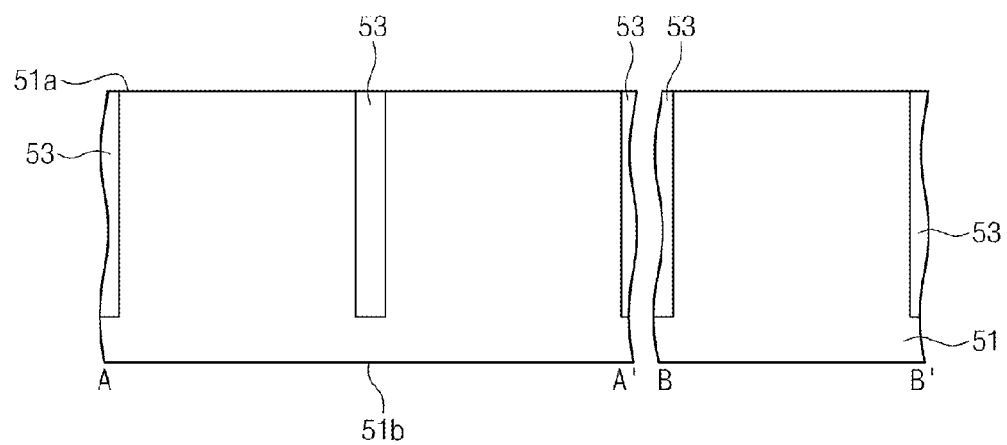

Referring to FIGS. 9A and 9B, a deep device isolation layer 53 is formed in a substrate 51 having first and second surfaces 51a and 51b opposite to each other to isolate pixels from each other. At this time, a bottom surface of the deep device isolation layer 53 may be spaced apart from the second surface 51b. In some example embodiments, the deep device isolation layer 53 may be formed of an insulating material such as silicon oxide. The deep device isolation layer 53 may be formed to have a mesh shape when viewed from a plan view.

Figure 10A:
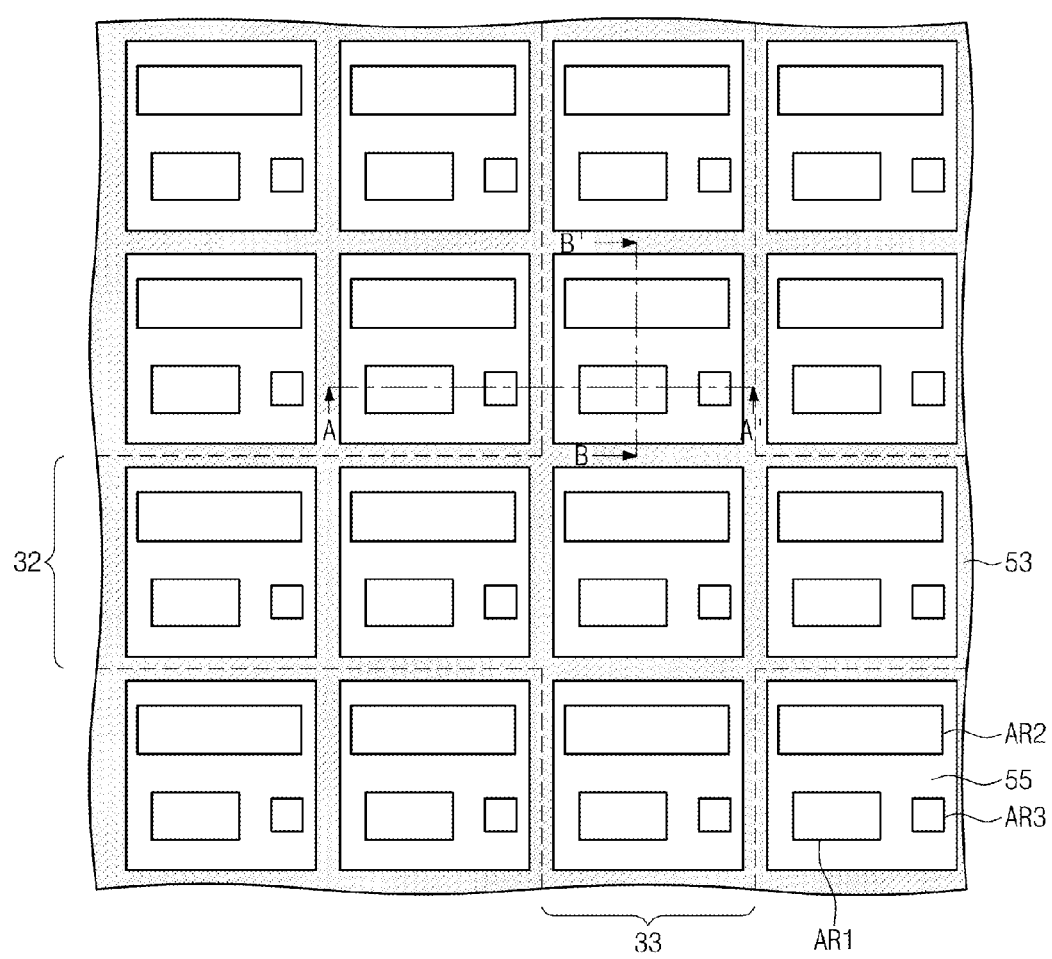
Figure 10B:
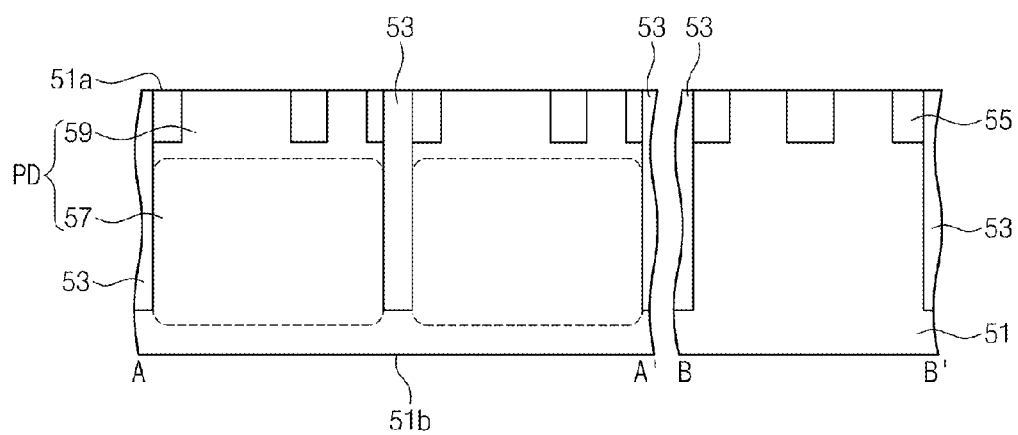

Referring to FIGS. 10A and 10B, ion implantation processes may be performed to a first dopant region 59 and a second dopant region 57 in the substrate 51 of each of the pixels isolated by the deep device isolation layer 53. Thus, a photoelectric converter PD is formed in each pixel. A shallow device isolation layer 53 that is adjacent to the first surface 51a may be formed in the substrate 51 to define active regions AR1, AR2, and AR3. A portion of the substrate 51 around the deep device isolation layer 55 may be removed to form a shallow trench, and the shallow trench may be filled with a filling insulating layer to form the shallow device isolation layer 55.

Figure 11A:
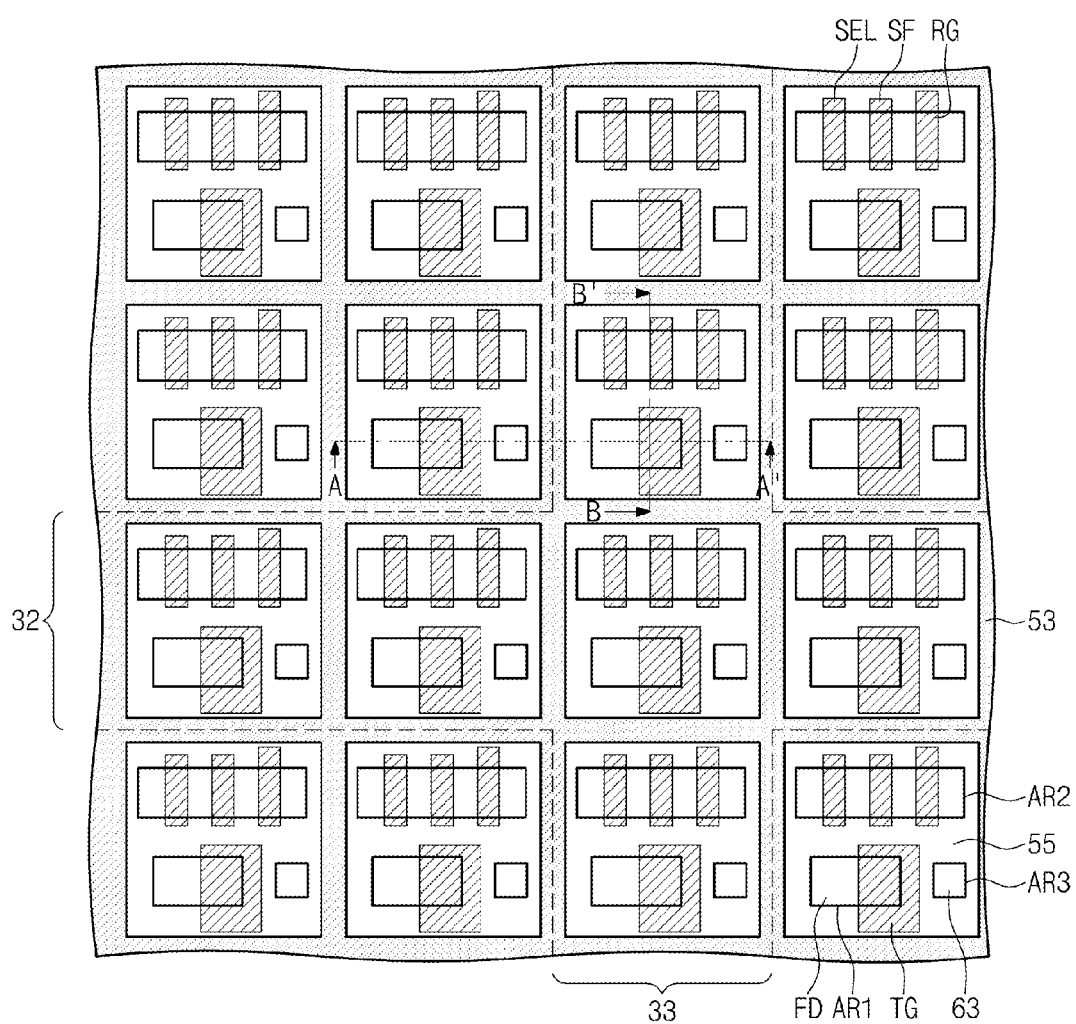
Figure 11B:
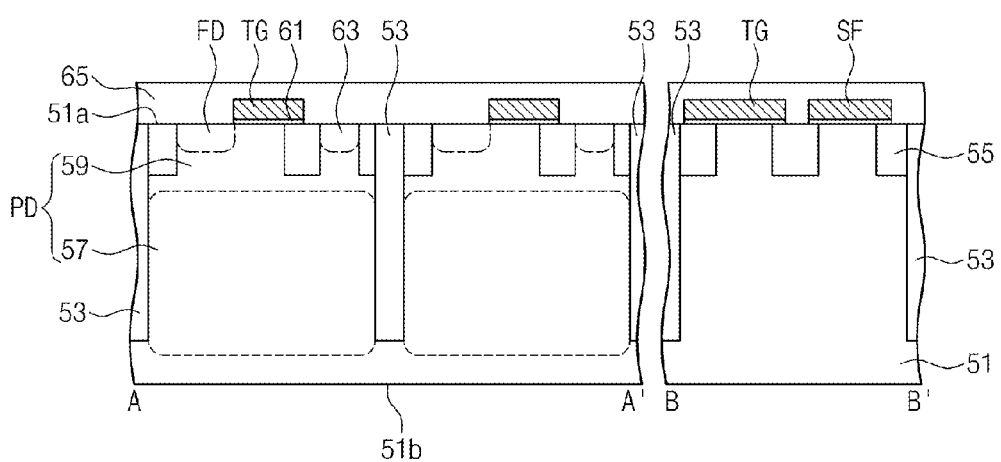

Referring to FIGS. 11A and 11B, a transfer gate TG may be formed to intersect the first active region AR1, and a reset gate RG, a source follower gate SF, and a selection gate SEL may be formed to intersect the second active region AR2. Ion implantation processes may be performed to form a floating diffusion region FD and a ground region 63. At this time, dopant regions that are used as source/drain regions of reset, source follower, and selection transistors may be formed in the second active region AR2. Next, a first interlayer insulating layer 65 may be formed to cover the first surface 51a.

Figure 12A:
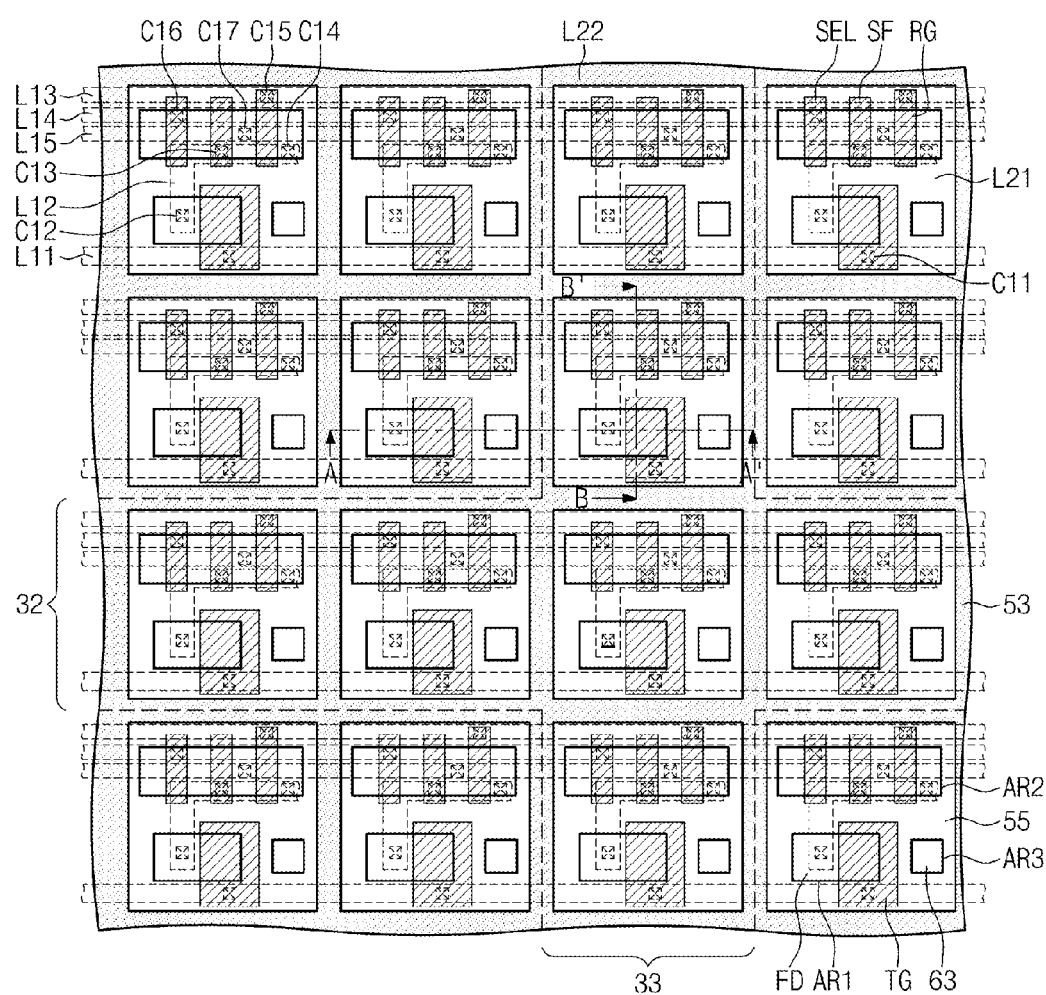
Figure 12B:
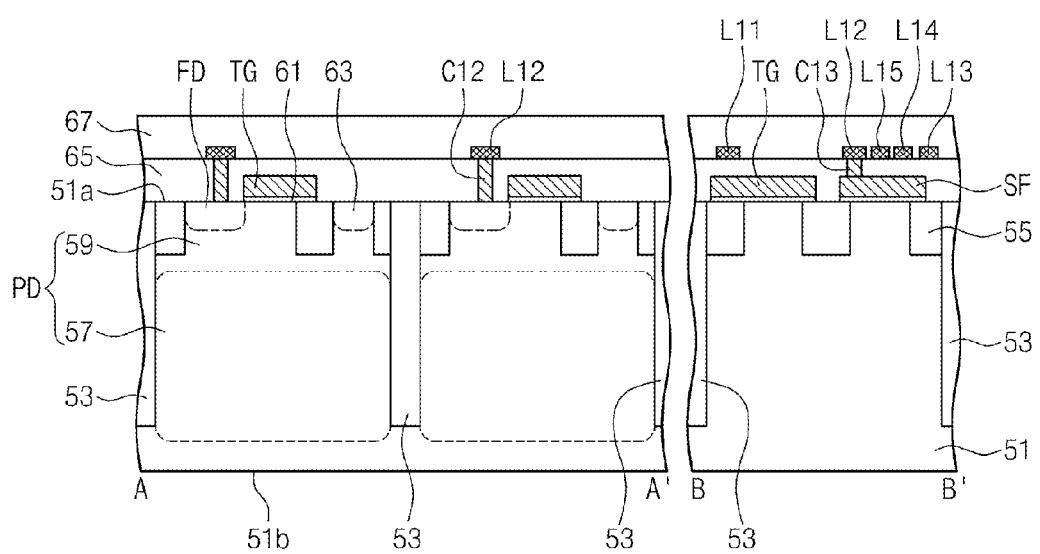

Referring to FIGS. 12A and 12B, first layer first to first layer seventh contacts C11 to C17 are formed to penetrate the first interlayer insulating layer 65. First layer first to first layer fifth signal lines L11 to L15 electrically connected to the contacts C11 to C17 are formed on the first interlayer insulating layer 65. A second interlayer insulating layer 67 is formed on the first interlayer insulating layer 65.

Figure 13A:
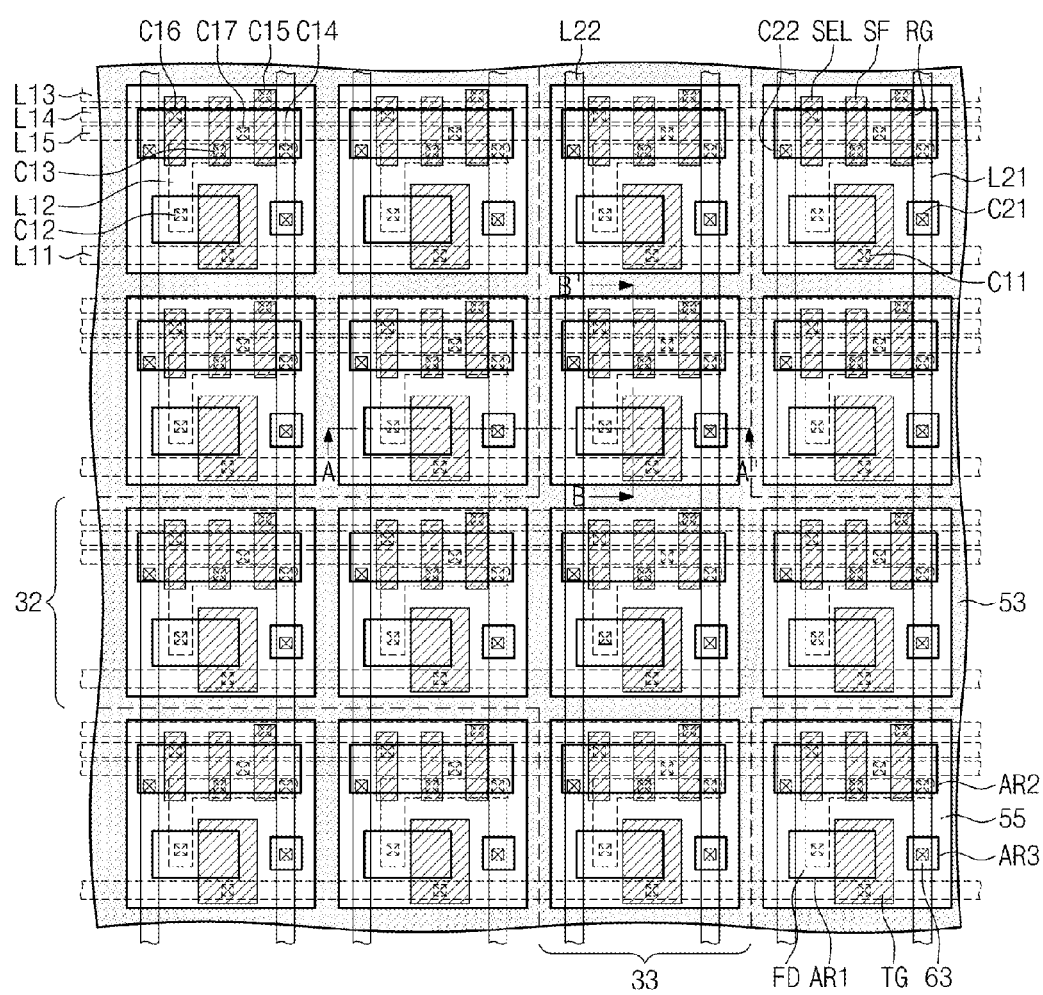
Figure 13B:
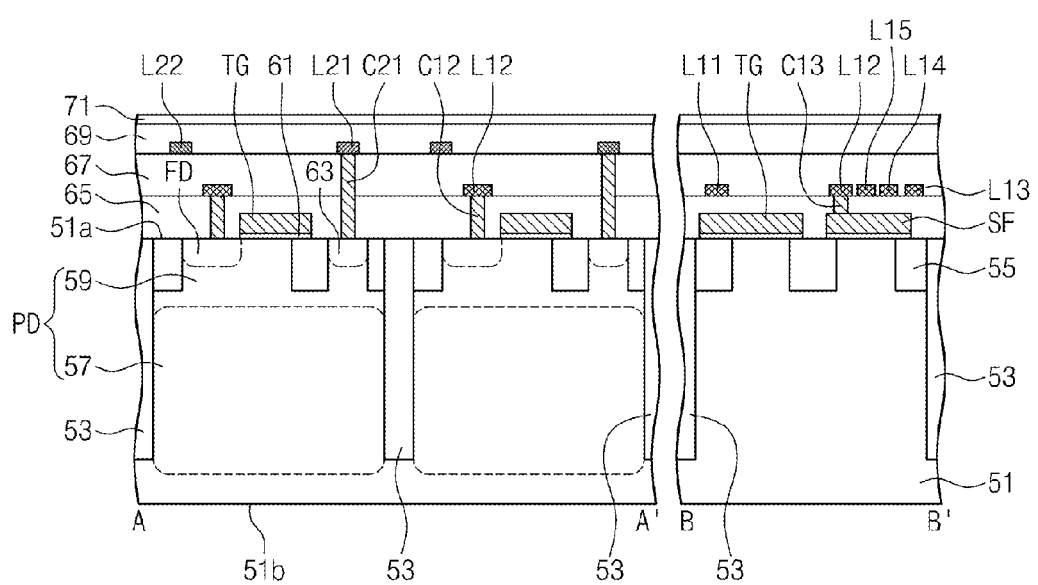
Figure 14A:
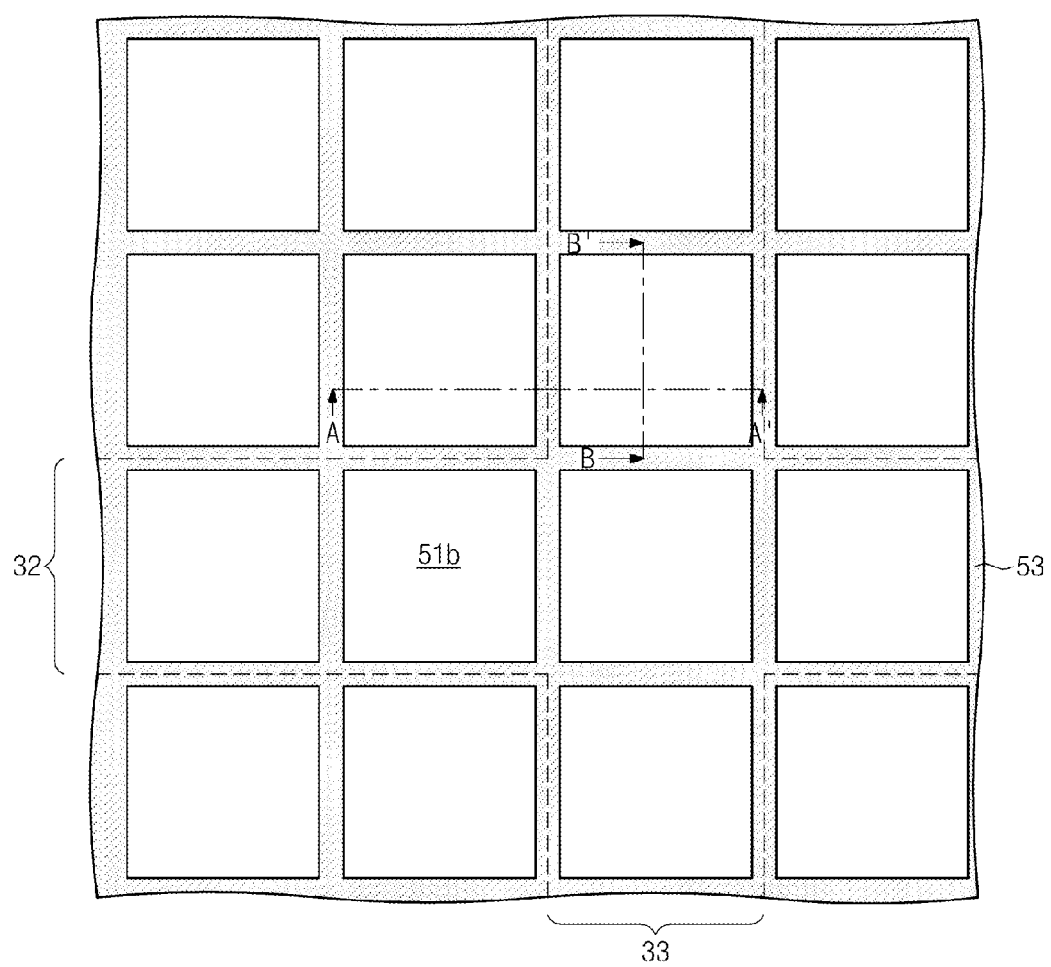
FIGS. 14A and 15A are plan views illustrating a method of fabricating an auto-focus image sensor having the lower layout of FIG. 7.

Referring to FIGS. 13A and 13B, second layer first and second layer second contacts C21 and C22 are formed to penetrate the second and first interlayer insulating layers 67 and 65. Second layer first and second layer second signal lines L21 and L22 are formed on the second interlayer insulating layer 67. A third interlayer insulating layer 69 and a first passivation layer 71 are sequentially formed on the second interlayer insulating layer 67.

Figure 14B:
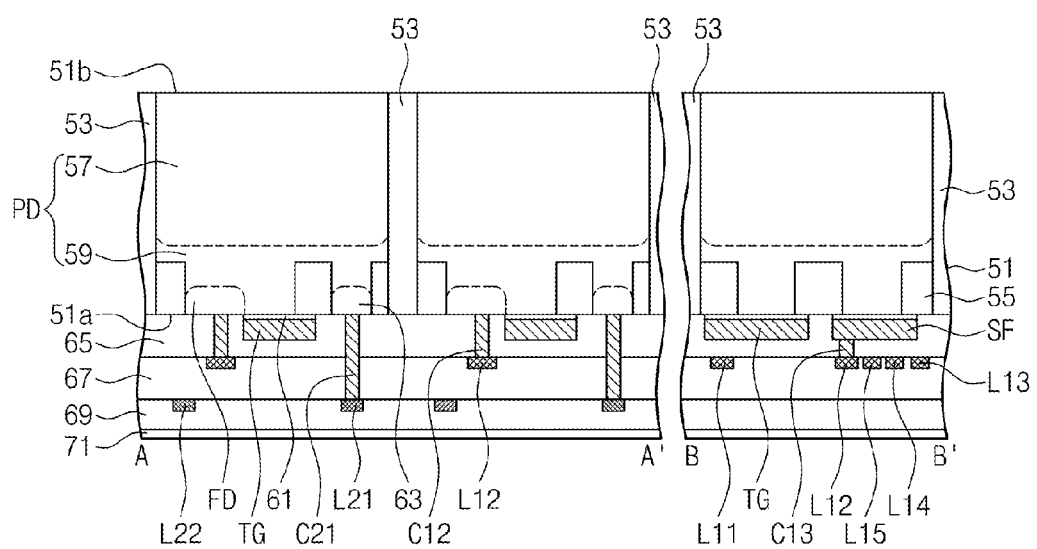
Figure 15A:
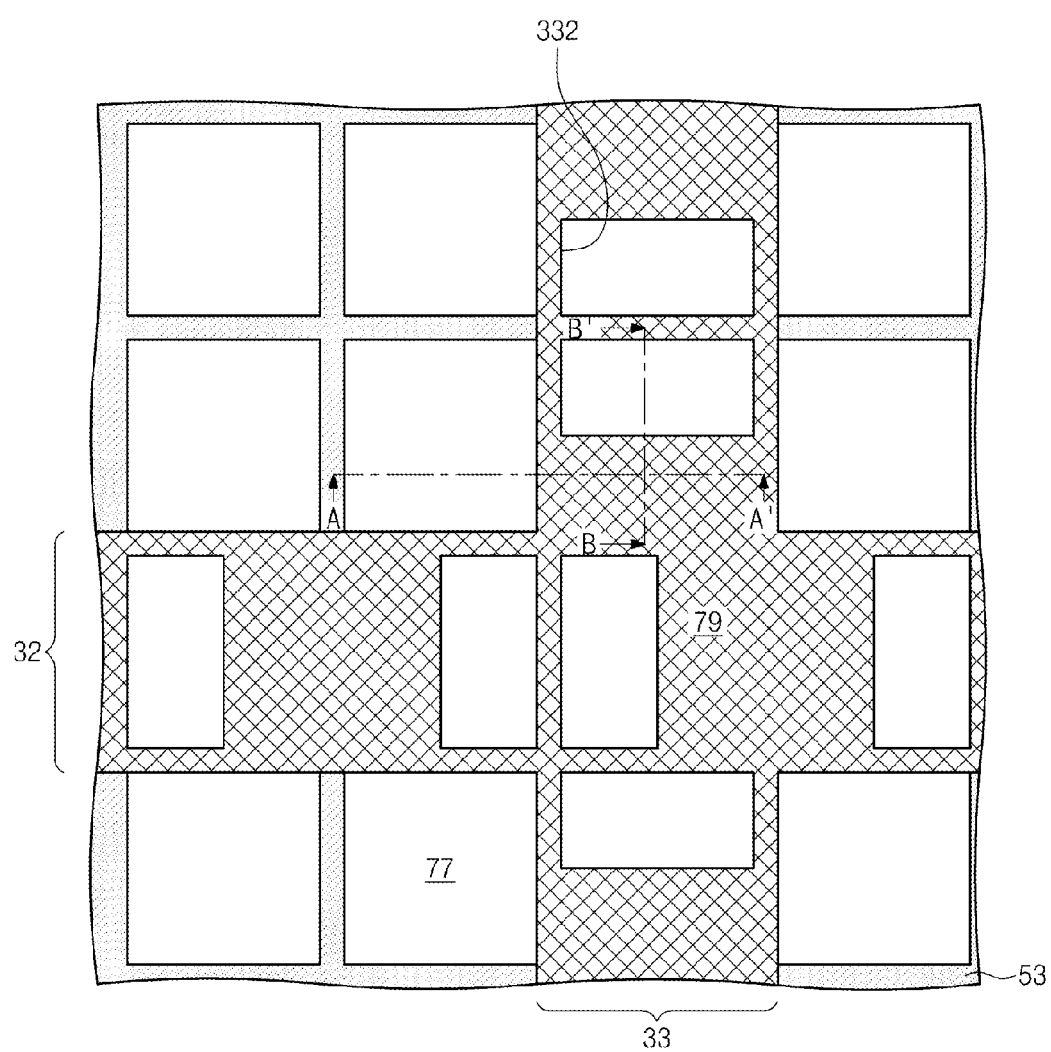

Referring to FIGS. 14A and 14B, the substrate 51 is turned over such that the second surface 51b faces upward. Next, a back grinding process may be performed on the second surface 51b, so a portion, which is adjacent to the second surface 51b, of the substrate 51 is removed to expose the deep device isolation layer 53.

Figure 15B:
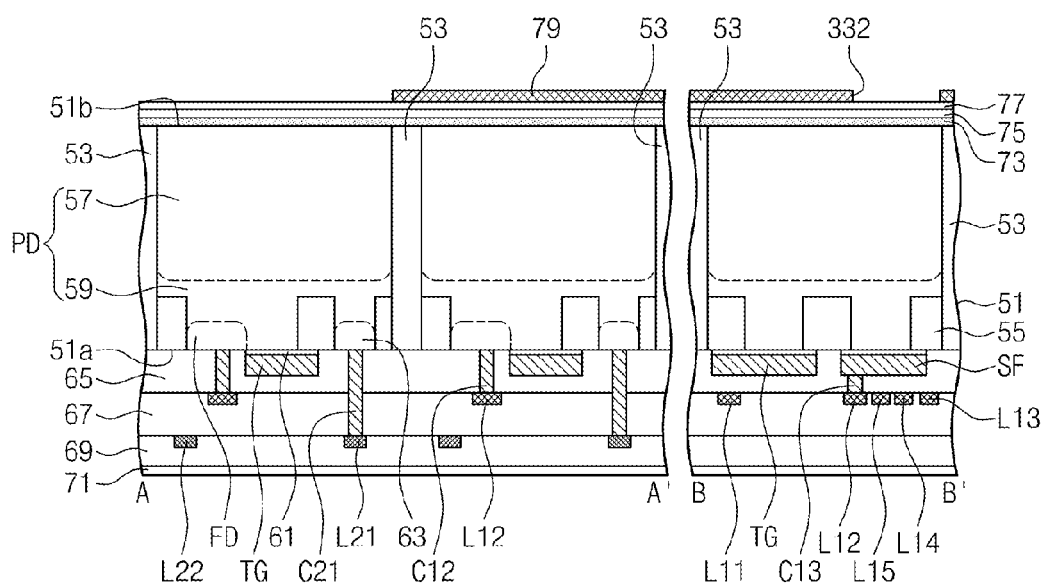

Referring to FIGS. 15A and 15B, a fixed charge layer 73 is formed on an entire portion of the second surface 51b. First and second insulating layers 75 and 77 are sequentially formed on the fixed charge layer 73. A light shielding pattern 79 is formed on the second insulating layer 77. In some embodiments, an opaque metal layer may be stacked on an entire top surface of the second insulating layer 77, and the stacked opaque metal layer may be etched to form the light shielding pattern 79. Alternatively, the light shielding pattern 79 may be formed by a damascene process using a process of forming a mask pattern (not shown), an electroplating process, and a planarization etching process.

Subsequently, as illustrated in FIGS. 7 and 8, the second passivation layer 83, the planarization layer 85, the color filter array 87, and the micro-lens array 35 may be sequentially formed on the light shielding pattern 79. Materials of the layers may be the same as described with reference to FIGS. 6 to 8.

In some example embodiments, the deep device isolation layer 53 is first formed. However, the inventive concepts are not limited thereto. In other example embodiments, the order of the processes described above may be changed. For example, the shallow device isolation layer 55 may be first formed to be adjacent to the first surface 51a, and then, the transistors and the signal lines may be formed. Subsequently, the back grinding process may be performed on the second surface 51b. Next, a portion of the substrate 51 may be etched from the second surface 51b grinded to form a deep trench, and the deep trench may be filled with an insulating layer to form the deep device isolation layer 53.

Figure 16:
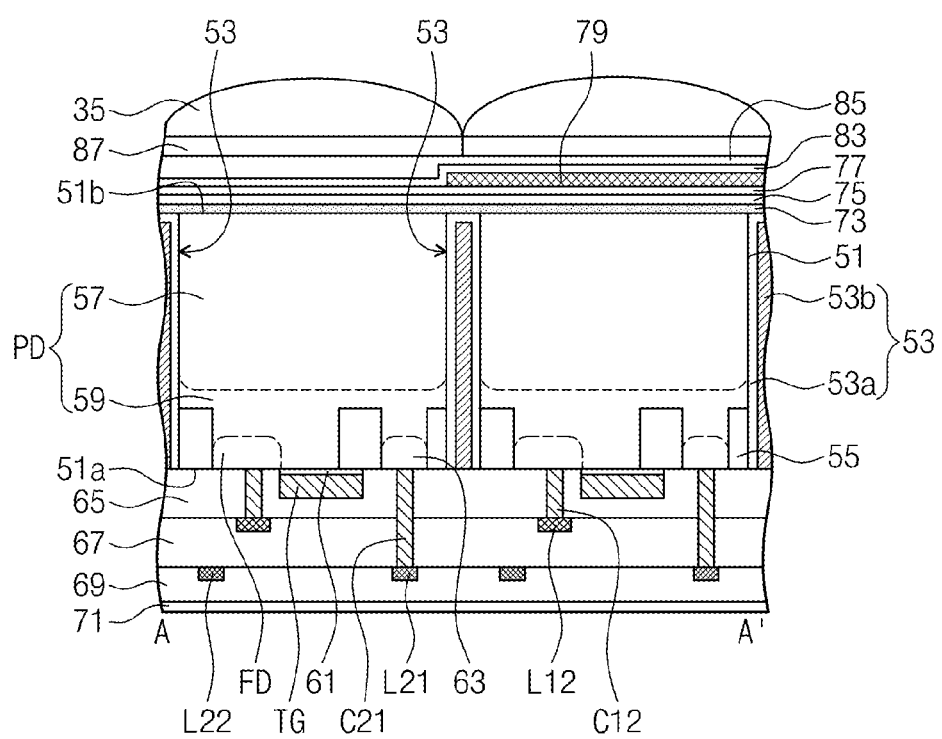
FIG. 16 is a cross-sectional view taken along a line A-A' of FIG. 6 or 7 to illustrate an auto-focus image sensor according to other example embodiments of the inventive concepts.

FIG. 16 is a cross-sectional view taken along a line A-A' of FIG. 6 or 7 to illustrate an auto-focus image sensor according to other example embodiments of the inventive concepts.

Referring to FIG. 16, in an auto-focus image sensor according to some example embodiments, a deep device isolation layer 53 may include a filling insulation layer 53a and a poly-silicon pattern 53b disposed within the filling insulation layer 53a. Since the poly-silicon pattern 53b has a substantially same thermal expansion coefficient as the substrate 51 formed of silicon, it is possible to reduce a physical stress caused by a difference between thermal expansion coefficients of materials. Other elements of the auto-focus image sensor according to some example embodiments may be similar to or the same as corresponding elements of the auto-focus image sensor described with reference to FIGS. 6 to 8.

Figure 17:
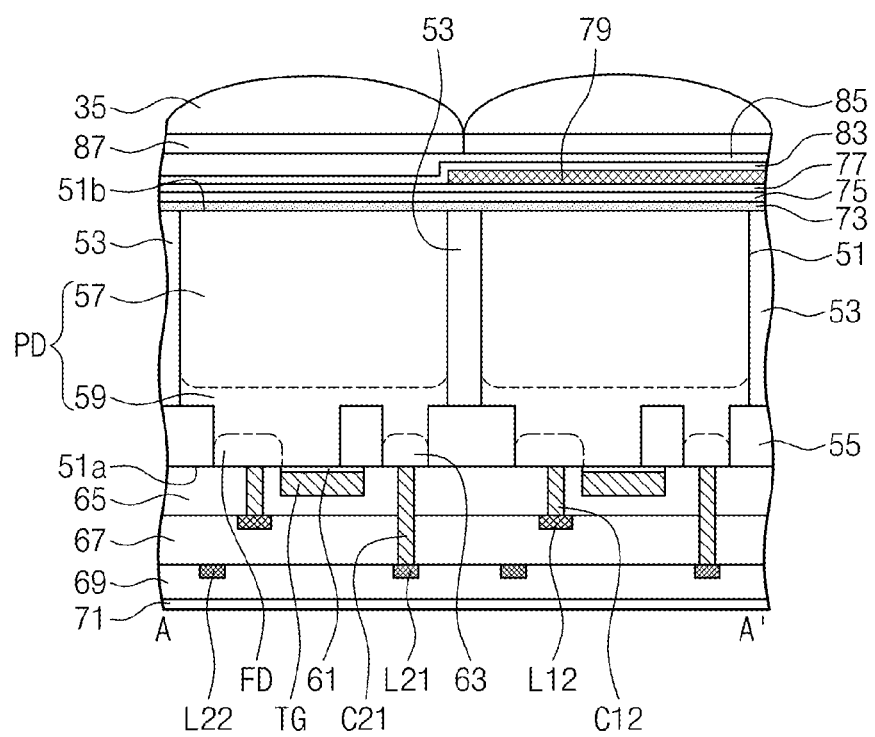
FIG. 17 is a cross-sectional view taken along a line A-A' of FIG. 6 or 7 to illustrate an auto-focus image sensor according to still other example embodiments of the inventive concepts.

FIG. 17 is a cross-sectional view taken along a line A-A' of FIG. 6 or 7 to illustrate an auto-focus image sensor according to still other example embodiments of the inventive concepts.

Referring to FIG. 17, in an auto-focus image sensor according to some example embodiments, a deep device isolation layer 53 is spaced apart from the first surface 51a. The deep device isolation layer 53 contacts a top surface of the shallow device isolation layer 55. A method of fabricating the auto-focus image sensor according to some example embodiments will be described. After the processes described with reference to FIG. 9B, a portion of the deep device isolation layer 53 and the substrate 51 adjacent thereto may be etched at the same time to form a shallow trench. The shallow trench may be filled with a filling insulating layer to form the shallow device isolation layer 55. Other elements of the auto-focus image sensor according to some example embodiments may be similar to or the same as corresponding elements of the auto-focus image sensor described with reference to FIGS. 6 to 8.

Figure 18A:
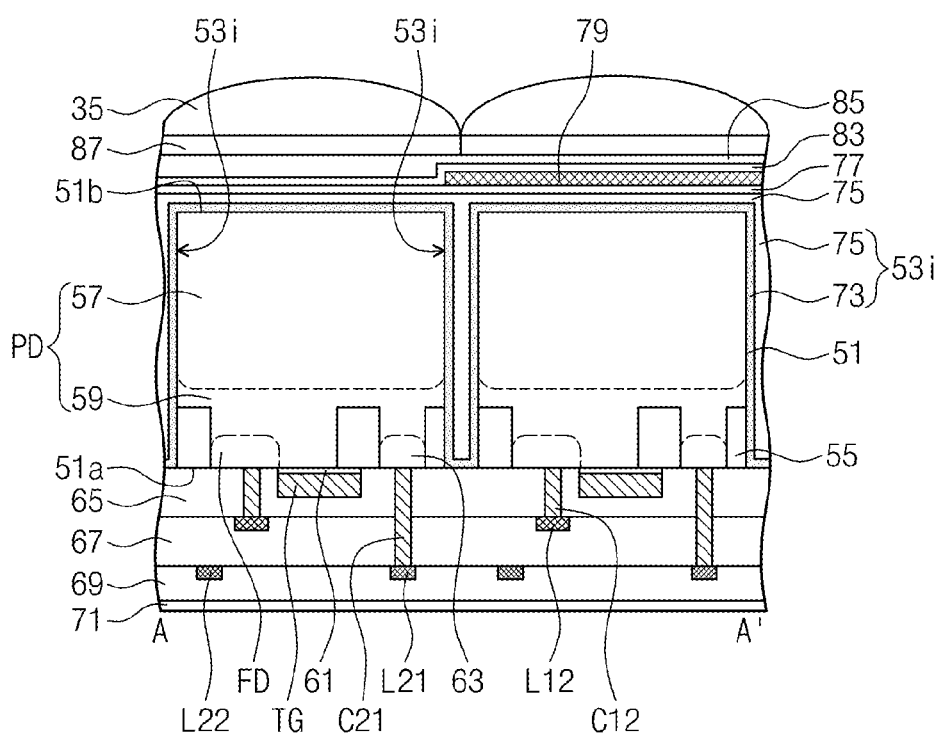
FIG. 18A is a cross-sectional view taken along a line A-A' of FIG. 6 or 7 to illustrate an auto-focus image sensor according to yet other example embodiments of the inventive concepts.

FIG. 18A is a cross-sectional view taken along a line A-A' of FIG. 6 or 7 to illustrate an auto-focus image sensor according to yet other example embodiments of the inventive concepts.

Referring to FIG. 18A, in an auto-focus image sensor according to some example embodiments, a deep device isolation layer 53i may include a fixed charge layer 73 and a first insulating layer 75. For example, the fixed charge layer 73 may include a hafnium oxide layer. The first insulating layer 75 may include a silicon oxide layer or a silicon nitride layer. The fixed charge layer 73 is disposed on the second surface 51b and surrounds sidewalls of the photoelectric converter PD, thereby further reducing a dark current characteristic. Other elements of the auto-focus image sensor according to some example embodiments may be similar to or the same as corresponding elements of the auto-focus image sensor described with reference to FIGS. 6 to 8.

Figure 18B:
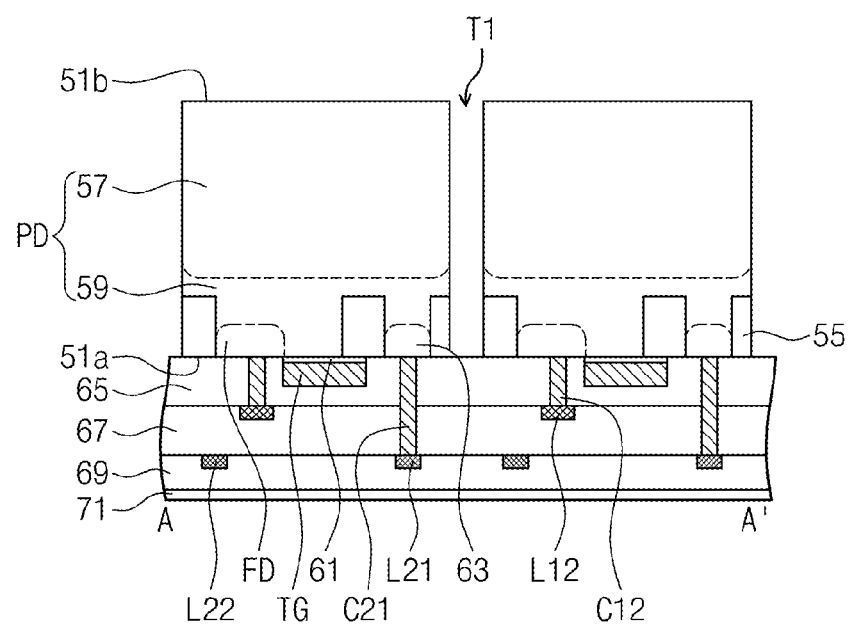
FIG. 18B is a cross-sectional view illustrating a method of fabricating the auto-focus image sensor of FIG. 18A.

FIG. 18B is a cross-sectional view illustrating a method of fabricating the auto-focus image sensor of FIG. 18A.

Referring to FIG. 18B, the deep device isolation layer 53 of the structure of FIG. 14B may be selectively removed to form a deep trench T1. Next, a fixed charge layer 73 and a first insulating layer 75 are conformally formed on an entire portion of the second surface 51b to fill the deep trench T1. Here, the deep device isolation layer 53 of FIG. 14B may be used as a sacrificial pattern. Thus, an additional etching mask for forming the deep trench T1 is not required to correct a misalignment problem. Other fabricating processes of example embodiments may be similar to or the same as corresponding processes of example embodiments described with reference to FIGS. 9B to 15B.

Figure 19A:
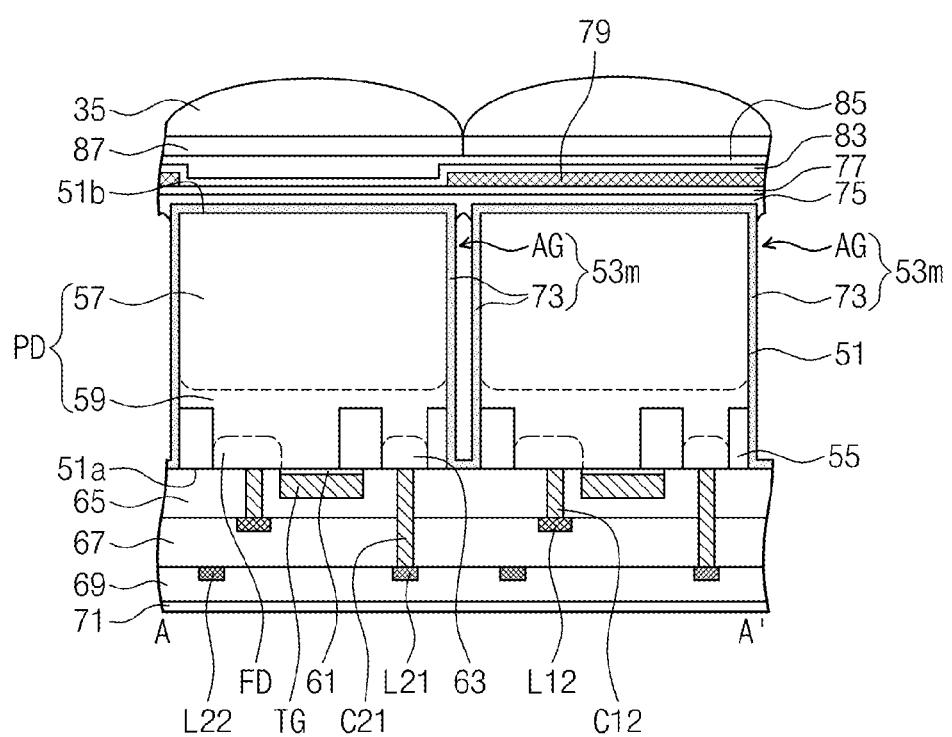
FIGS. 19A and 19B are cross-sectional views taken along a line A-A' of FIG. 6 or 7 to illustrate an auto-focus image sensor according to yet still other example embodiments of the inventive concepts.
Figure 19B:
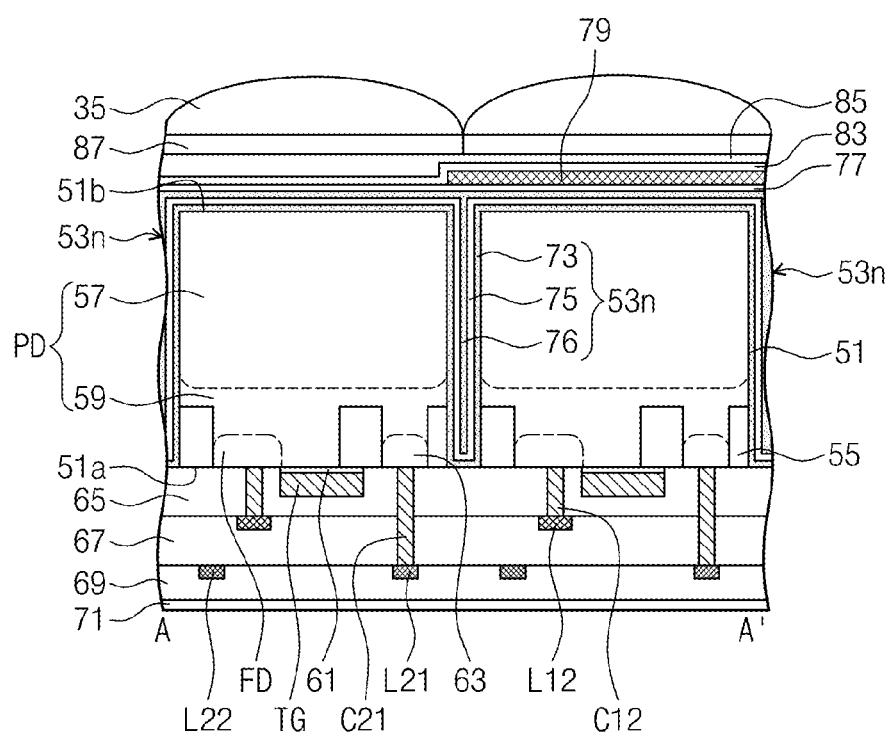

FIGS. 19A and 19B are cross-sectional views taken along a line A-A' of FIG. 6 or 7 to illustrate an auto-focus image sensor according to yet still other example embodiments of the inventive concepts.

Referring to FIG. 19A, in an auto-focus image sensor according to some example embodiments, a deep device isolation layer 53m may include a fixed charge layer 73 and an air gap region AG. In the method of fabricating the auto-focus image sensor of FIG. 18B, the first insulating layer 75 may be formed by a deposition method having a poor step coverage characteristic (e.g., a physical vapor deposition (PVD) deposition method) to form the air gap region AG. Other elements of the auto-focus image sensor according to some example embodiments may be similar to or the same as corresponding elements of the auto-focus image sensor described with reference to FIG. 18A.

Referring to FIG. 19B, a deep device isolation layer 53n may include a fixed charge layer 73, a first insulating layer 75, and a gap-fill assistant layer 76 in an auto-focus image sensor according to some example embodiments. The fixed charge layer 73 may be, for example, a hafnium oxide layer. The first insulating layer 75 may be, for example, a silicon oxide layer or a silicon nitride layer. The gap-fill assistant layer 76 may be, for example, a hafnium oxide layer.

Figure 20:
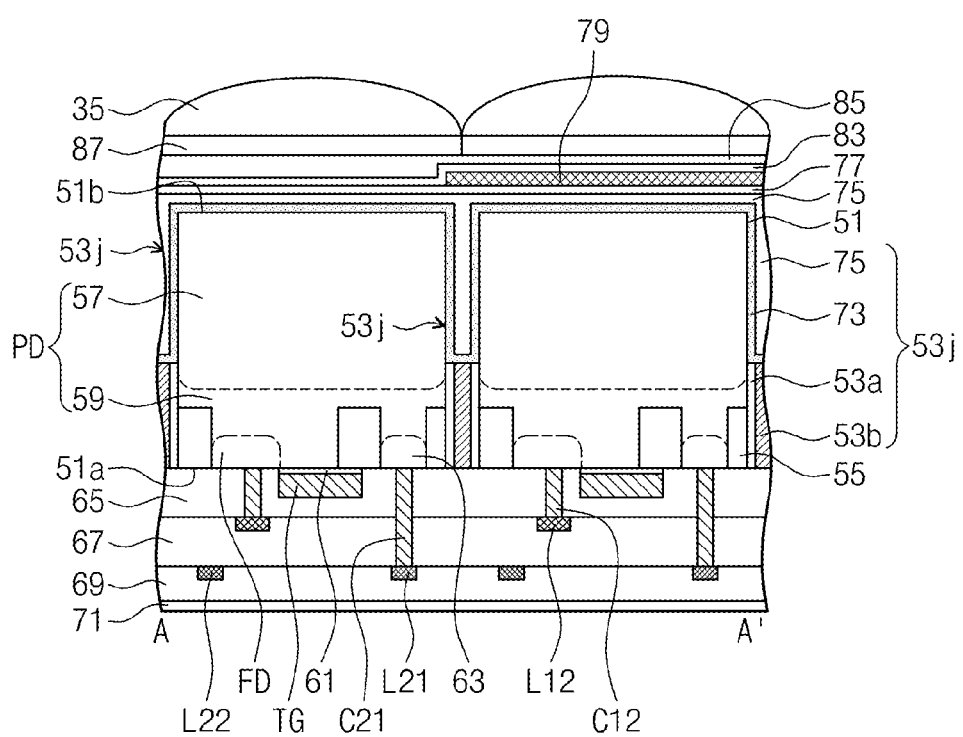
FIG. 20 is a cross-sectional view taken along a line A-A' of FIG. 6 or 7 to illustrate an auto-focus image sensor according to yet still other example embodiments of the inventive concepts.

FIG. 20 is a cross-sectional view taken along a line A-A' of FIG. 6 or 7 to illustrate an auto-focus image sensor according to yet still other example embodiments of the inventive concepts.

Referring to FIG. 20, a deep device isolation layer 53j may include a filling insulation layer 53a, a poly-silicon pattern 53b, a fixed charge layer 73, and a first insulating layer 75 in an auto-focus image sensor according to some example embodiments. The fixed charge layer 73 may be in contact with both the filling insulation layer 53a and the poly-silicon pattern 53b.

The auto-focus image sensor of FIG. 20 may be fabricated by a combining method of the method of fabricating the auto-focus image sensor of FIG. 16 and the method of fabricating the auto-focus image sensor of FIG. 18A. In other words, an initial deep device isolation layer 53 may be formed to include the filling insulation layer 53a and the poly-silicon pattern 53b, and a portion of the initial deep device isolation layer 53 may remain when the deep trench T1 is formed. Subsequently, the fixed charge layer 73 and the first insulating layer 75 may be formed in the deep trench T1, thereby forming the deep device isolation layer 53j. Other fabricating processes of some example embodiments may be similar to or the same as corresponding processes of example embodiments described with reference to FIGS. 9B to 15B.

Figure 21:
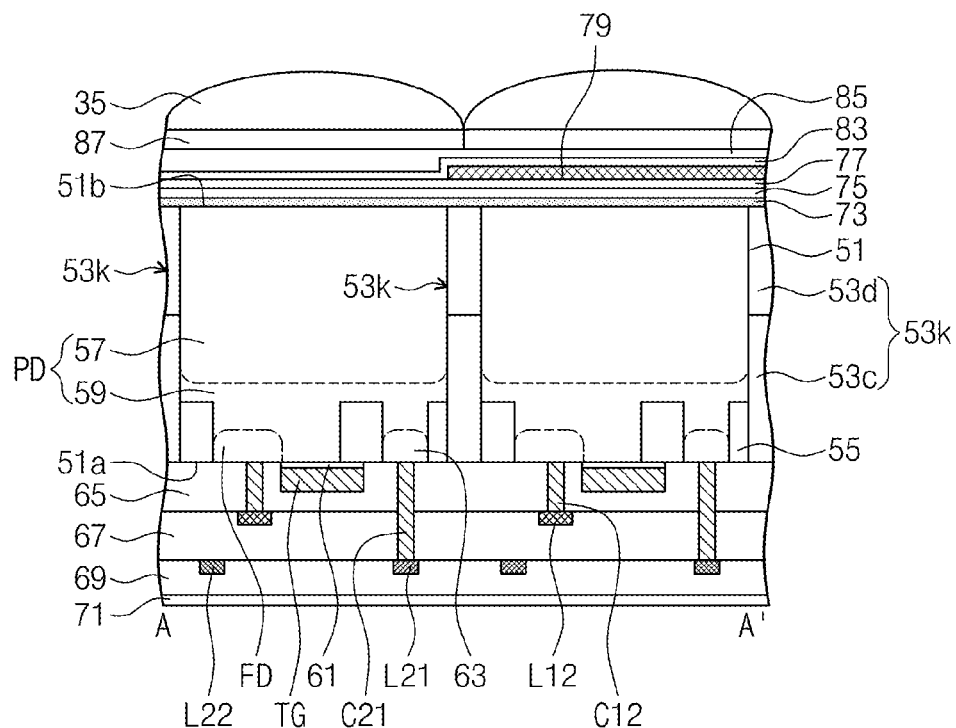
FIG. 21 is a cross-sectional view taken along a line A-A' of FIG. 6 or 7 to illustrate an auto-focus image sensor according to yet still other example embodiments of the inventive concepts.

FIG. 21 is a cross-sectional view taken along a line A-A' of FIG. 6 or 7 to illustrate an auto-focus image sensor according to yet still other embodiments of the inventive concepts.

Referring to FIG. 21, a deep device isolation layer 53k may include a first sub-deep device isolation layer 53c and a second sub-deep device isolation layer 53d in an auto-focus image sensor according to some example embodiments. The sub-deep device isolation layers 53c and 53d may include at least one of a silicon oxide layer, a poly-silicon layer, or a fixed charge layer.

Figure 22:
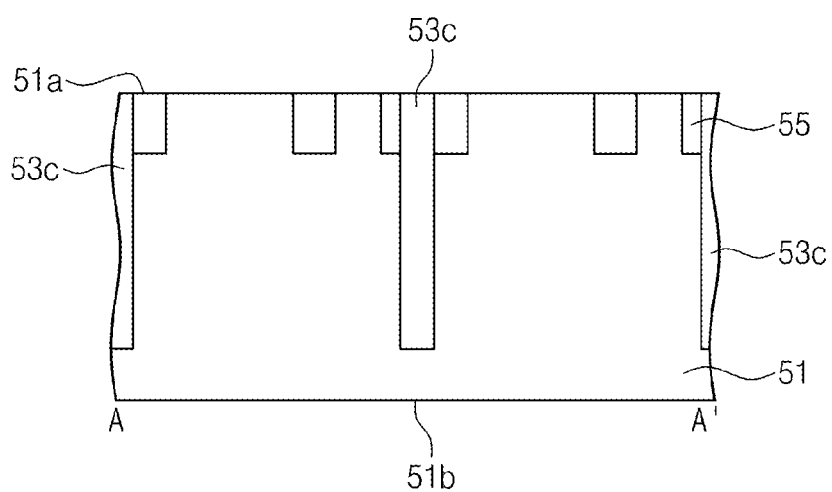
FIGS. 22 to 24 are cross-sectional views illustrating a method of fabricating the auto-focus image sensor of FIG. 21.
Figure 23:
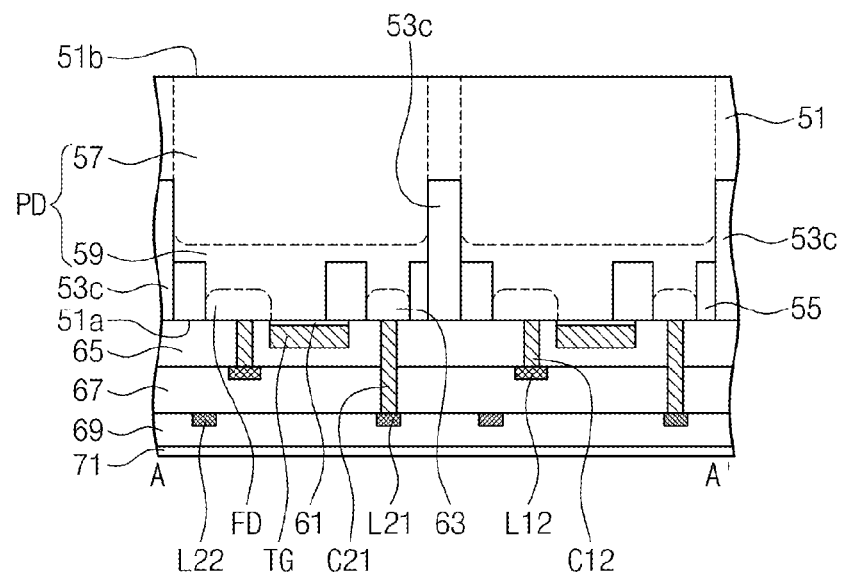
Figure 24:
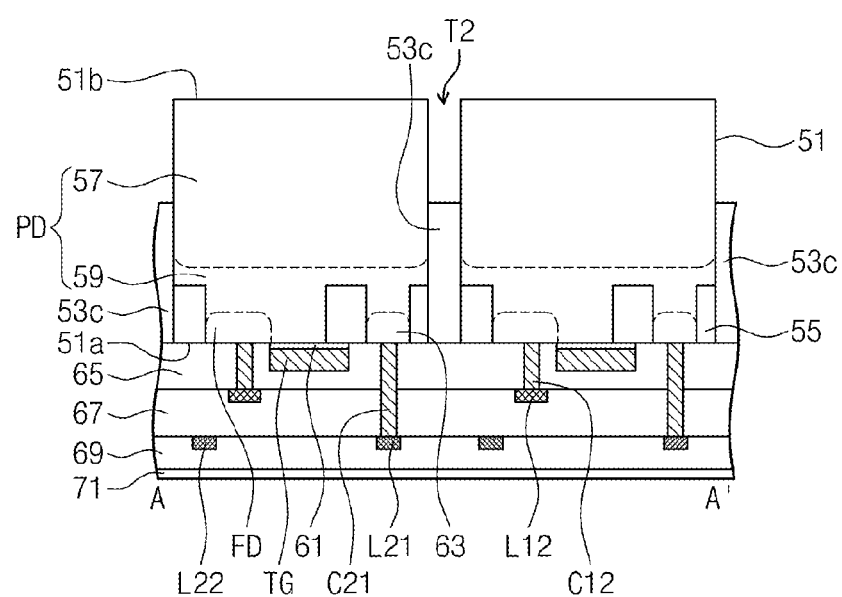

FIGS. 22 to 24 are cross-sectional views illustrating a method of fabricating the auto-focus image sensor of FIG. 21.

Referring to FIG. 22, a first sub-deep device isolation layer 53c is formed in a substrate 51. The first sub-deep device isolation layer 53c is adjacent to the first surface 51a and is spaced apart from the second surface 51b. A shallow device isolation layer 55 is formed in the substrate 51. At this time, the shallow device isolation layer 55 may be formed to be shallower than the first sub-deep device isolation layer 53c.

Referring to FIG. 23, transistors, lines L11 to L17, L21, and L22, interlayer insulating layers 65, 67, and 69, and a first passivation layer 71 may be formed on the first surface 51a, and the substrate 51 may be then overturned. Subsequently, a back grinding process may be performed on the second surface 51b. At this time, the first sub-deep device isolation layer 53c is not exposed.

Referring to FIG. 24, a portion, adjacent to the second surface 51b, of the substrate 51 may be etched to form a deep trench T2 exposing the first sub-deep device isolation layer 53c. At this time, a depth of the deep trench T2 may be shallower than a depth of the deep trench T1 of FIG. 18B.

Referring again to FIG. 21, subsequently, the second sub-deep device isolation layer 53d may be formed to fill the deep trench T2. Other fabricating processes of some example embodiments may be similar to or the same as corresponding processes of example embodiments described with reference to FIGS. 9B to 15B.

In the fabricating method according to some example embodiments, the substrate 51 may be etched from the first surface 51a by a desired (or alternatively) predetermined depth and may be then etched from the second surface 51b by a desired (or alternatively) predetermined depth to form the deep device isolation layer 53k. Thus, an etching depth of each of the etching processes for the formation of the deep device isolation layer 53k having a desired depth may be reduced to reduce burden of the etching processes. In addition, a depth of each of the trenches for the formation of the deep device isolation layer 53k may be reduced to improve a gap-fill characteristic.

Figure 25:
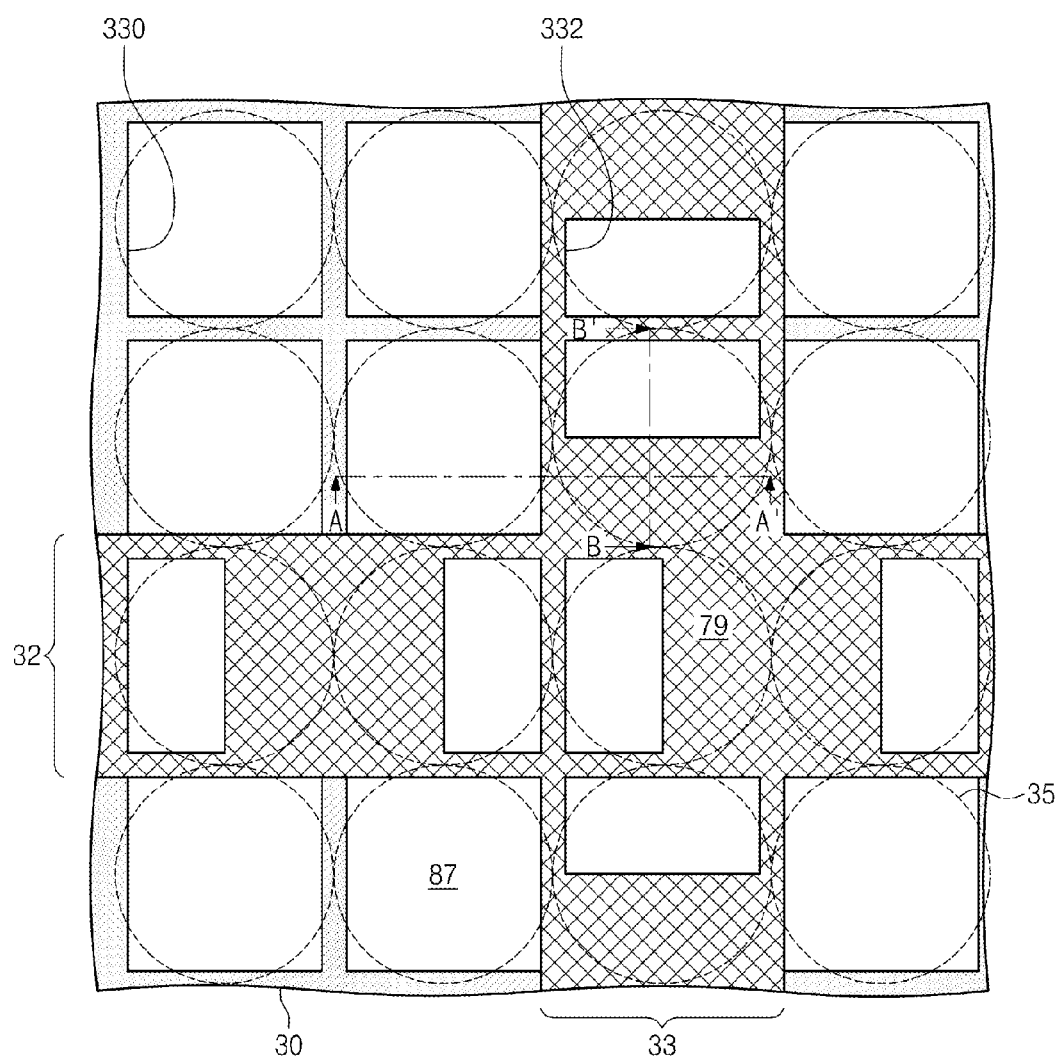
FIG. 25 is a lower layout of an auto-focus image sensor according to yet still other example embodiments of the inventive concepts.
Figure 26:
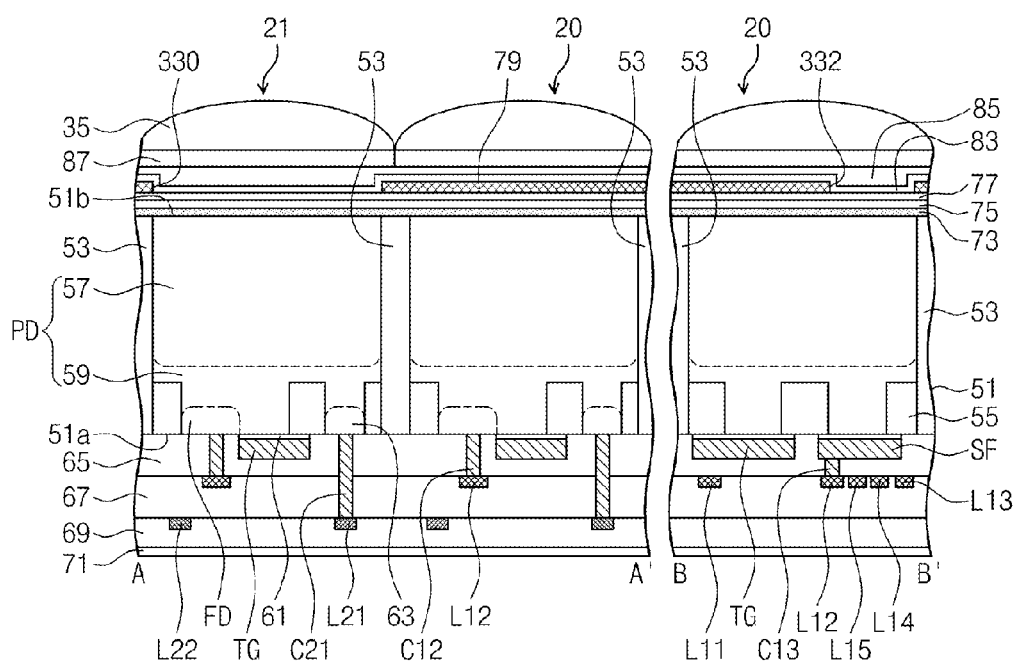
FIG. 26 is a cross-sectional view taken along lines A-A' and B-B' of FIG. 25.

FIG. 25 is a lower layout of an auto-focus image sensor according to yet still other example embodiments of the inventive concepts. FIG. 26 is a cross-sectional view taken along lines A-A' and B-B' of FIG. 25.

Referring to FIGS. 25 and 26, a light shielding pattern 79 may extend into an image detection region 30 in an auto-focus image sensor according to some example embodiments. The light shielding pattern 79 may overlap with the deep device isolation layer 53 and may have a mesh shape. The light shielding pattern 79 may further include second openings 330 exposing the image pixels. The light shielding pattern 79 may reduce or prevent crosstalk in the image detecting region 30.

The light shielding pattern 79 may be connected to a ground voltage or a reference voltage, so the auto-focus image sensor may be more stably operated.

Figure 27:
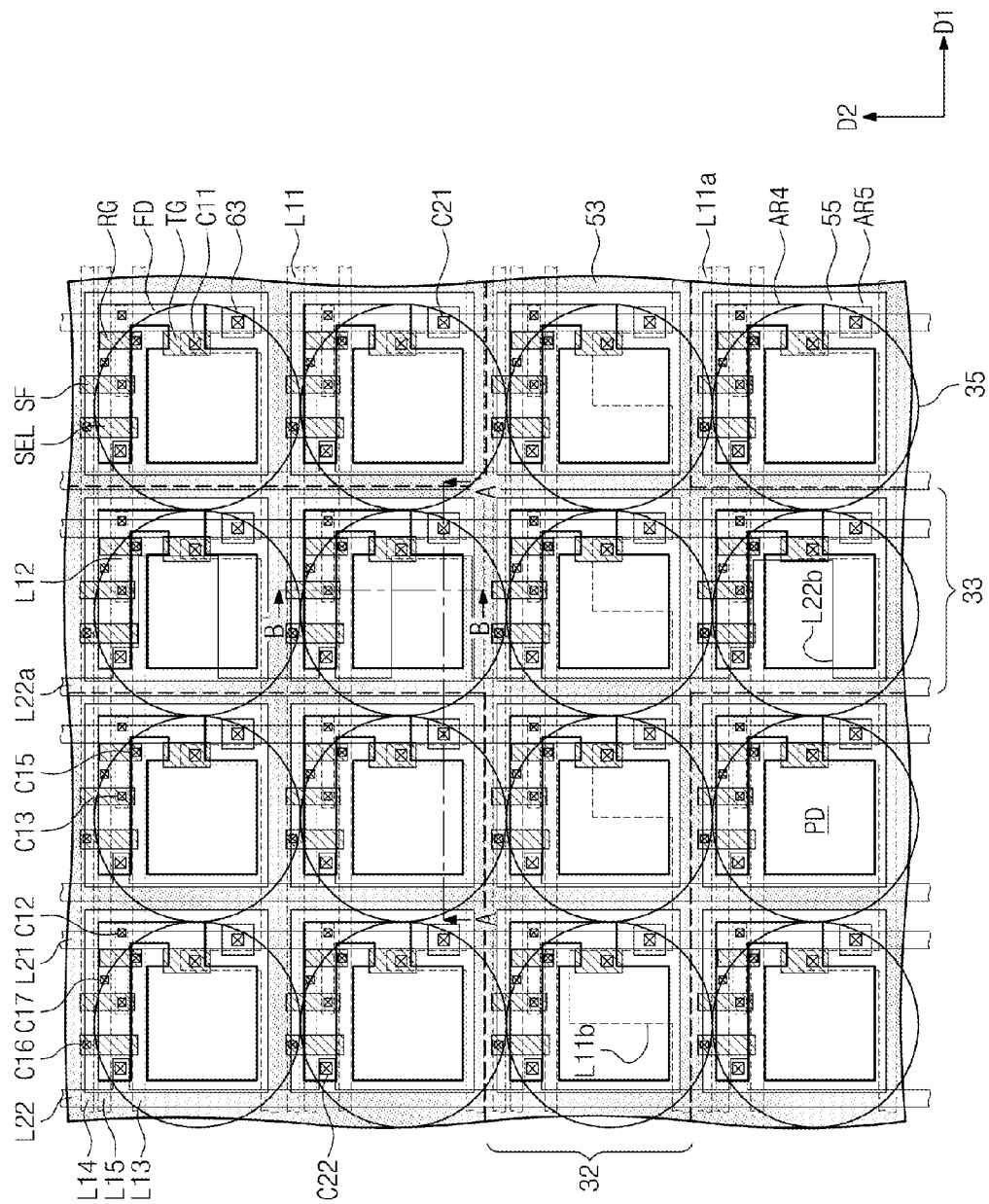
FIG. 27 is a lower layout of an auto-focus image sensor according to yet still other example embodiments of the inventive concepts.
Figure 28:
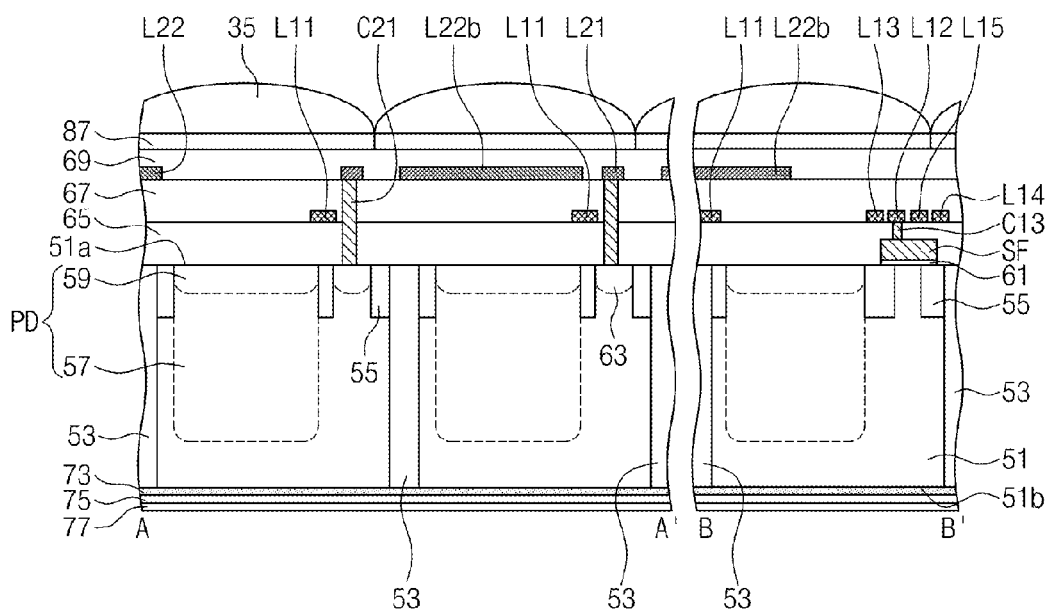
FIG. 28 is a cross-sectional view taken along lines A-A' and B-B' of FIG. 27.

FIG. 27 is a lower layout of an auto-focus image sensor according to yet still other example embodiments of the inventive concepts. FIG. 28 is a cross-sectional view taken along lines A-A' and B-B' of FIG. 27.

Referring to FIGS. 27 and 28, a deep device isolation layer 53 is disposed in a substrate 51 having first and second surfaces 51a and 52b opposite to each other to isolate pixels from each other. A shallow device isolation layer 55 is disposed from the first surface 51a into the substrate 51. The shallow device isolation layer 55 defines active regions AR4 and AR5. A transfer gate TG, a reset gate RG, a source follower gate SF, and a selection gate SEL are disposed on the first surface 51a. A photoelectric converter PD is disposed at a side of the transfer gate TG, and a floating diffusion region FD is disposed at another side of the transfer gate TG. Contacts C11 to C17, C21, and C22, signal lines L11 to L15, L21, and L22, interlayer insulating layers 65, 67, and 69, a color filter array 87, and a micro-lens array 35 are disposed on the first surface 51a. A fixed charge layer 73, a first insulating layer 75, and a second insulating layer 77 may be sequentially stacked on the second surface 51b. The second insulating layer 77 may act as a passivation layer.

In some example embodiments, the signal lines L11 to L15, L21, and L22 may not overlap with the photoelectric converter PD in an image detecting region 30 if possible. Thus, a path of light incident on the photoelectric converter PD may not be blocked. However, some signal lines L11a and L22a may perform both a signal transmission function and a light shielding function in focus detecting regions 32 and 33. To achieve this, shapes of some signal lines L11a and L22a may be modified to perform the light shielding function in the focus detecting regions 32 and 33.

Figure 29:
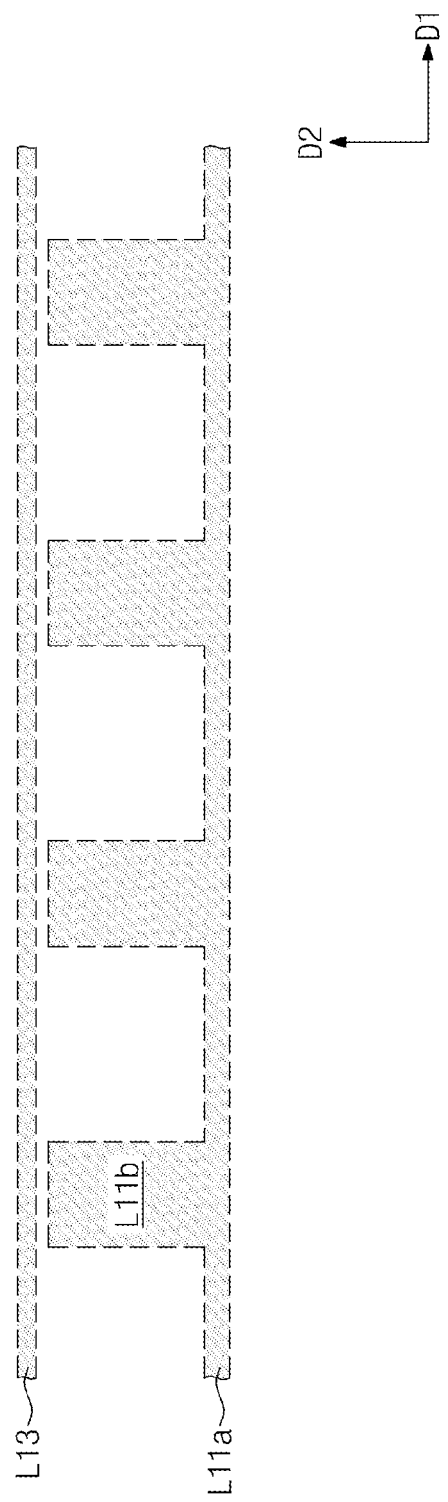
FIG. 29 is a layout of a first layer first signal line and a first layer third signal line in a first focus detecting region.

FIG. 29 is a layout of a first layer first signal line and a first layer third signal line in a first focus detecting region.

Referring to FIGS. 27, 28, and 29, in the first focus detecting region 32, a first layer first signal line L11a may include a first protrusion L11b that protrudes to overlap with the photoelectric converter PD of the AF pixel. Thus, the first layer first signal line L11a and the first layer third signal line L13 adjacent thereto may provide shapes similar to the first openings 332 of FIGS. 5A to 5C in the first focus detecting region 32. The first layer first signal line L11a which also performs the light shielding function may be disposed at the same height as the first layer second to fifth signal lines L12 to L15 from the first surface 51a.

Figure 30:
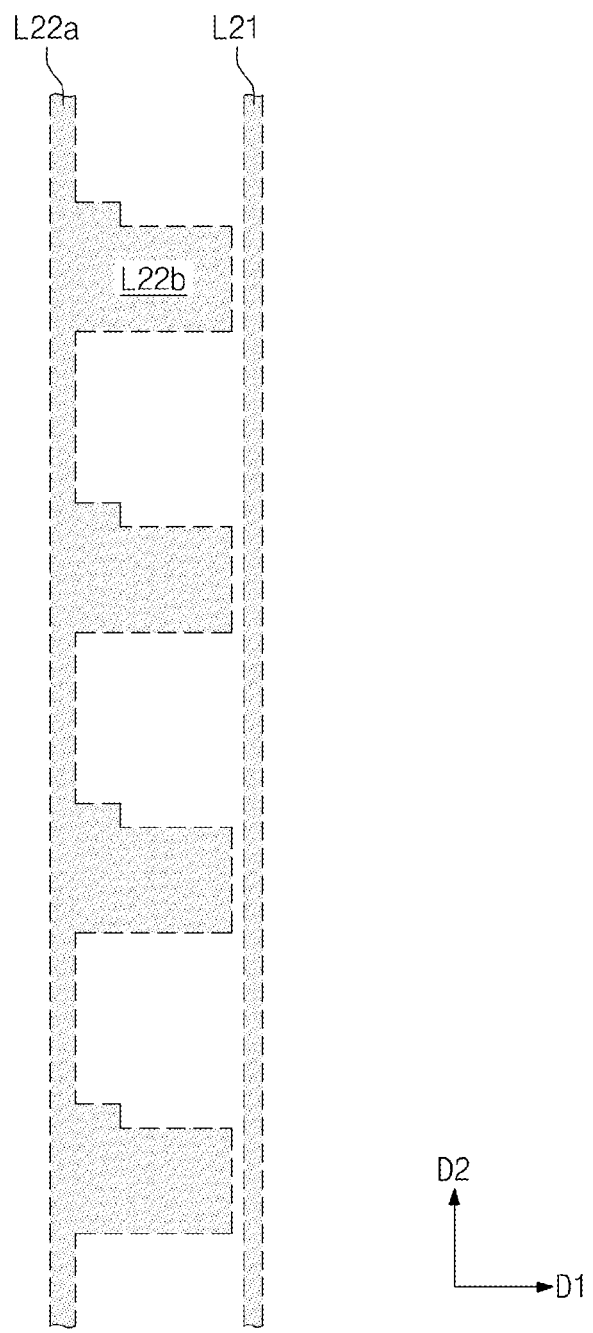
FIG. 30 is a layout of a second layer first signal line and a second layer second signal line in a second focus detecting region.
Figure 31:
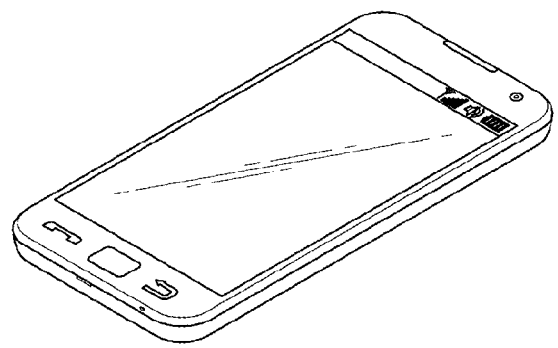
FIGS. 31 to 35 illustrate embodiments of a digital image processing device including an auto-focus image sensor according to example embodiments of the inventive concepts.
Figure 32:
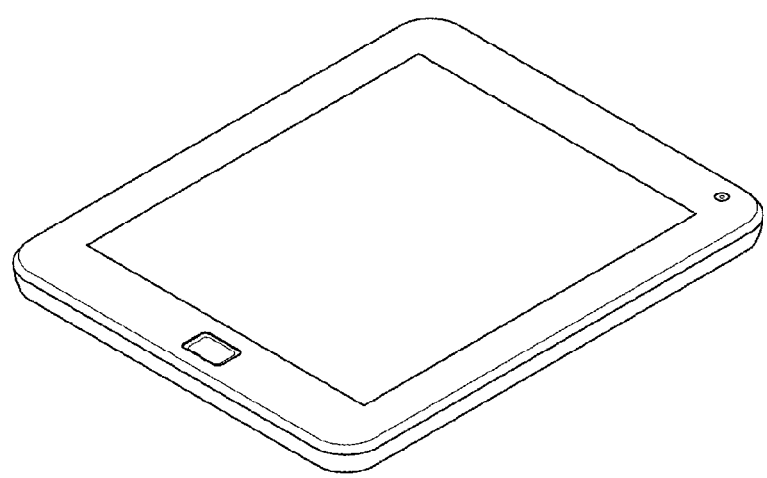
Figure 33:
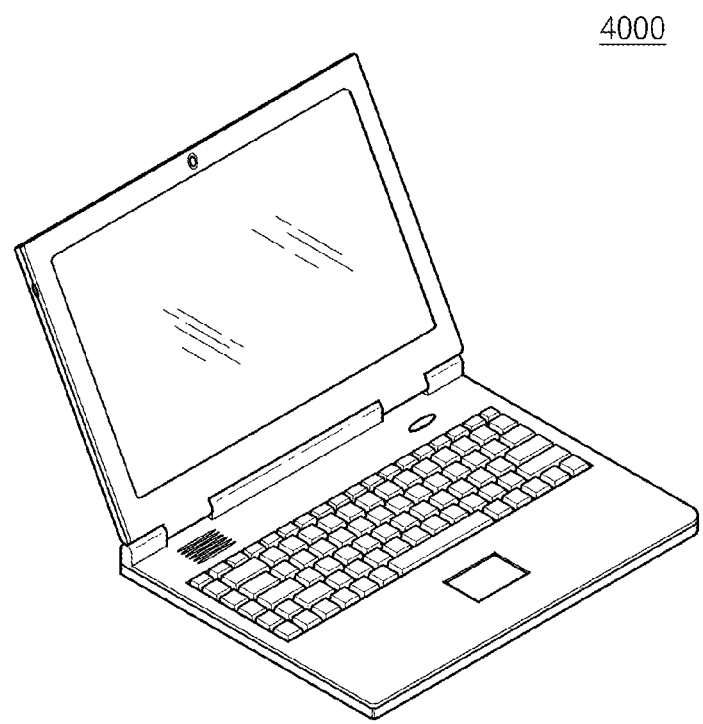
Figure 34:
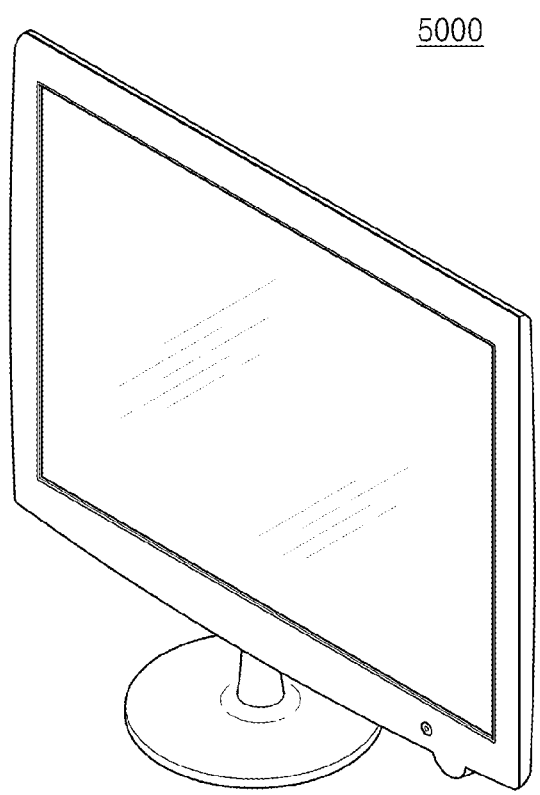
Figure 35:
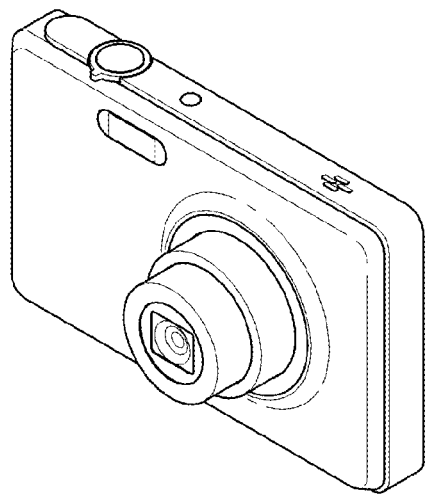

FIG. 30 is a layout of a second layer first signal line and a second layer second signal line in a second focus detecting region.

Referring to FIGS. 27, 28, and 30, in the second focus detecting region 33, a second layer second signal line L22a may include a second protrusion L22b that protrudes to overlap with the photoelectric converter PD of the AF pixel. Thus, the second layer second signal line L22a and the second layer first signal line L21 adjacent thereto may provide shapes similar to the first openings 332 of FIGS. 5A to 5C in the second focus detecting region 33. The second layer first signal line L22a which also performs the light shielding function may be disposed at the same height as the second layer second signal line L21 from the first surface 51a.

Other elements and other fabricating processes of some example embodiments may be similar to or the same as corresponding elements and corresponding fabricating processes described with reference to FIGS. 6 to 15B.

FIGS. 31 to 35 illustrate example embodiments of a digital image processing device including an auto-focus image sensor according to example embodiments of the inventive concepts. For example, the digital image processing device according to example embodiments of the inventive concepts may be applied to a mobile or smart phone 2000 illustrated in FIG. 31 and/or a tablet or smart tablet 3000 illustrated in FIG. 32. In addition, the digital image processing device according to example embodiments of the inventive concepts may be applied to a notebook computer 4000 of FIG. 33 and/or a television or smart television 5000 of FIG. 34. Furthermore, the digital image processing device according to example embodiments of the inventive concepts may be applied to a digital camera or digital camcorder 6000 of FIG. 35.

Figure 36:
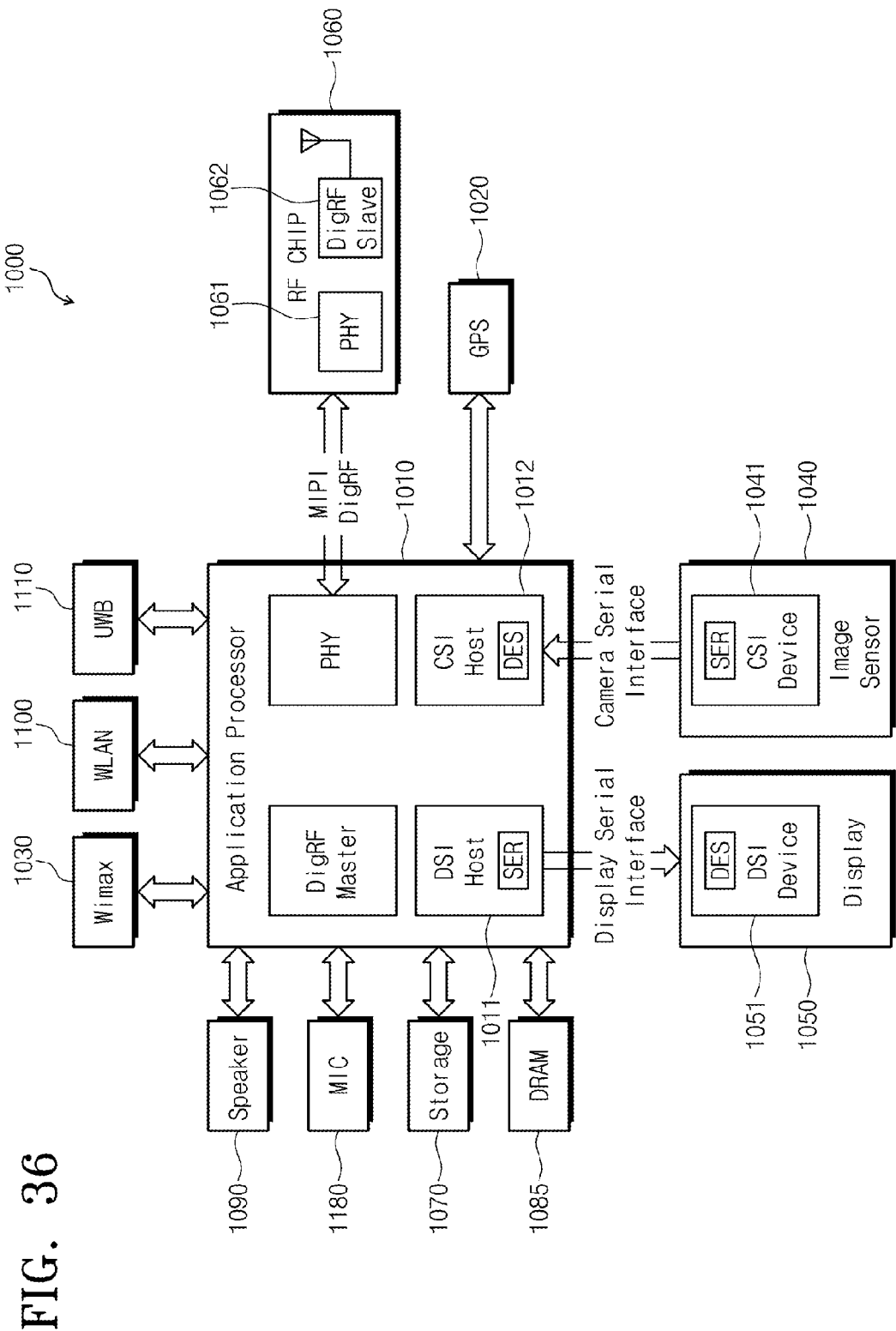
FIG. 36 is a schematic block diagram an interface and an electronic system including an auto-focus image sensor according to example embodiments of the inventive concepts.

FIG. 36 is a schematic block diagram an interface and an electronic system including an auto-focus image sensor according to example embodiments of the inventive concepts.

Referring to FIG. 36, an electronic system 1000 may be realized as a data processing device capable of using or supporting mobile industry processor interface (MIPI), e.g., a portable phone, a personal digital assistant (PDA), a portable multimedia player (PMP), or a smart phone.

The electronic system 1000 may include an application processor 1010, an image sensor 1040, and a display 1050. The image sensor 1040 may be one of the auto-focus image sensors according to example embodiments of the inventive concepts.

A CSI host 1012 realized in the application processor 1010 may serially communicate with a CSI device 1041 of the image sensor 1040 through a camera serial interface (CSI). For example, an optical de-serializer may be realized in the CSI host 1012, and an optical serializer may be realized in the CSI device 1041.

A DSI host 1011 realized in the application processor 1010 may serially communicate with a DSI device 1051 of the display 1050 through a display serial interface (DSI). For example, an optical serializer may be realized in the DSI host 1011, and an optical de-serializer may be realized in the DSI device 1051.

The electronic system 1000 may further include a radio frequency (RF) chip 1060 capable of communicating with the application processor 1010. A PHY 1013 of the electronic system 1000 may exchange data with a PHY 1061 of the RF chip 1060 according to MIPI DigRF.

The electronic system 1000 may further include a global positioning system (GPS) 1020, a storage 1070, a microphone 1080, a DRAM 1085, and speaker 1090. The electronic system 1000 may communicate using Wimax 1030, WLAN 1100, and UWB 1110.

In the auto-focus image sensor according to example embodiments of the inventive concepts, the pixels are isolated from each other by the deep device isolation portion, so the crosstalk between neighboring pixels may be reduced or prevented. In addition, the sensor includes the fixed charge layer being in contact with at least one surface of the substrate. Holes may be accumulated around the fixed charge layer, and thus, the occurrence of the dark current and the white spots may be effectively reduced.

Moreover, the poly-silicon pattern may be disposed within the deep device isolation portion. Since the poly-silicon pattern has a substantially same thermal expansion coefficient as the substrate formed of silicon, it is possible to reduce the physical stress caused by the difference between the thermal expansion coefficients of materials.

As a result, example embodiments of the inventive concepts may provide an auto-focus image sensor capable of realizing a cleaner image and a digital image processing device including the same.

While the inventive concepts have been described with reference to example embodiments, it will be apparent to those skilled in the art that various changes and modifications may be made without departing from the spirits and scopes of the inventive concepts. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. An auto-focus image sensor comprising:
a substrate including at least one first pixel configured to detect a phase difference and at least one second pixel configured to detect an image, the substrate including a first surface on which a gate electrode is disposed and a second surface opposite to the first surface;
a fixed charge layer on the second surface;
a deep device isolation portion in the substrate to isolate the at least one first pixel from the at least one second pixel;
a shallow device isolation portion adjacent to the first surface to define an active region; and
a light shielding pattern on the substrate of the at least one first pixel,
wherein an amount of light incident on the first pixel is smaller than the amount of light incident on the second pixel by the light shielding pattern, and
the deep device isolation portion penetrates the substrate to be in contact with both the fixed charge layer and the shallow device isolation portion.

2. The auto-focus image sensor of claim 1, wherein light is incident through the first surface,
wherein the light shielding pattern is on the first surface, and
wherein charge generated from the first pixel is transmitted through the light shielding pattern.

3. The auto-focus image sensor of claim 2, further comprising:
an interconnection on the first surface in the second pixel,
wherein charge generated from the second pixel is transmitted through the interconnection, and
wherein the light shielding pattern and the interconnection are at the same height from the first surface.

4. The auto-focus image sensor of claim 3, wherein the light shielding pattern has a width greater than that of the interconnection.

5. The auto-focus image sensor of claim 1, wherein light is incident through the second surface, and
wherein the light shielding pattern is on the second surface.

6. The auto-focus image sensor of claim 5, wherein the deep device isolation portion has a mesh structure,
wherein the light shielding pattern has a mesh structure that overlaps with the deep device isolation portion when viewed from a plan view, and
wherein an area of the light shielding pattern in the first pixel is greater than that of the light shielding pattern in the second pixel.

7. The auto-focus image sensor of claim 6, wherein the light shielding pattern is configured to receive a ground voltage or a reference voltage.

8. The auto-focus image sensor of claim 1, wherein the light shielding pattern has: a first opening exposing the first pixel and a second opening exposing the second pixel, and
wherein an area of the first opening is smaller than that of an area of the second opening.

9. The auto-focus image sensor of claim 1, further comprising:
an interlayer insulating layer on the first surface;
wherein the deep device isolation portion penetrates the substrate to be in contact with the interlayer insulating layer.

10. The auto-focus image sensor of claim 1, wherein the deep device isolation portion includes: a filling insulation layer and a poly-silicon pattern within the filling insulation layer.

11. The auto-focus image sensor of claim 1, wherein a part of the fixed charge layer extends into the substrate and the deep device isolation portion includes: a filling insulation layer and the part of the fixed charge layer between the filling insulation layer and the substrate.

12. The auto-focus image sensor of claim 11, wherein the filling insulation layer extends onto the second surface, and
wherein the fixed charge layer contacts the second surface.

13. The auto-focus image sensor of claim 11, wherein the fixed charge layer includes a metal oxide or metal fluoride that includes at least one selected from a group consisting of hafnium (Hf), zirconium (Zr), aluminum (Al), tantalum (Ta), titanium (Ti), yttrium (Y), and a lanthanoid.

14. The auto-focus image sensor of claim 11, wherein the deep device isolation portion further includes: a gap-fill assistant layer spaced apart from the fixed charge layer and in contact with the filling insulation layer.

15. The auto-focus image sensor of claim 1, wherein a part of the fixed charge layer extends into the substrate, and the deep device isolation portion includes: the part of the fixed charge layer in contact with a sidewall of the substrate and an air gap region exposing the fixed charge layer.

16. The auto-focus image sensor of claim 1, wherein a part of the fixed charge layer extends into the substrate and the deep device isolation portion includes:
a poly-silicon pattern in a first trench extending from the first surface toward the second surface;
a first filling insulation layer in contact with both sidewalls of the poly-silicon pattern in the first trench;
the part of the fixed charge layer in a second trench the second trench overlapping with the first trench, the fixed charge layer in contact with both the first filling insulation layer and the poly-silicon pattern, and the fixed charge layer covering an inner sidewall of the second trench; and
a second filling insulation layer filling the second trench.

17. An auto-focus image sensor comprising:
a substrate including at least one first pixel configured to detect a phase difference and at least one second pixel configured to detect an image, the substrate including a first surface on which a gate electrode is disposed and a second surface opposite to the first surface;
a fixed charge layer on the second surface;
an insulation layer on the fixed charge layer;
an isolation portion configured to isolate the at least one first pixel from at least one second pixel; and
a light shield on the substrate and between the at least one first pixel and incident light,
wherein a part of the fixed charge layer extends into the substrate and defines sidewalls of an air gap,
the part of the fixed charge layer and the air gap constitutes the isolation portion, and
a part of the insulation layer defines a top surface of the air gap.

18. The auto-focus image sensor of claim 17, wherein an amount of light incident on the at least one first pixel is smaller than an amount of light incident on the at least one second pixel.

19. The auto-focus image sensor of claim 17, wherein the isolation portion has a mesh structure and surrounds the at least one first pixel and the at least one second pixel in at least two directions.

20. The auto-focus image sensor of claim 17, the auto-focus image sensor further comprising:
   a color filter and a micro-lens on the first surface or the second surface,
   wherein the isolation portion penetrates the substrate and is exposed at the first and second surfaces.

\* \* \* \* \*